(12) United States Patent
Yamada et al.

(10) Patent No.: US 12,225,830 B2
(45) Date of Patent: Feb. 11, 2025

(54) MAGNETORESISTANCE EFFECT ELEMENT AND MAGNETIC RECORDING ARRAY

(71) Applicant: TDK CORPORATION, Tokyo (JP)

(72) Inventors: Shogo Yamada, Tokyo (JP); Minoru Ota, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 617 days.

(21) Appl. No.: 17/542,647

(22) Filed: Dec. 6, 2021

(65) Prior Publication Data

US 2022/0165934 A1 May 26, 2022

Related U.S. Application Data

(63) Continuation-in-part of application No. PCT/JP2021/005660, filed on Feb. 16, 2021.

(30) Foreign Application Priority Data

Feb. 19, 2020 (JP) ................................. 2020-026411

(51) Int. Cl.
*H10N 50/80* (2023.01)
*G11C 11/16* (2006.01)
(Continued)

(52) U.S. Cl.
CPC ............ *H10N 50/80* (2023.02); *G11C 11/161* (2013.01); *H10B 61/22* (2023.02); *H10N 50/01* (2023.02); *H10N 50/85* (2023.02)

(58) Field of Classification Search
CPC ........ H10N 50/80; H10N 50/01; H10B 61/22; G11C 11/161
See application file for complete search history.

(56) References Cited

U.S. PATENT DOCUMENTS

2009/0296454 A1  12/2009  Honda et al.
2010/0091555 A1  4/2010  Fukami
(Continued)

FOREIGN PATENT DOCUMENTS

JP   2013-118417 A   6/2013
JP   5206414 B2      6/2013
(Continued)

OTHER PUBLICATIONS

Apr. 27, 2021 International Search Report issued in International Patent Application No. PCT/JP2021/005660.

*Primary Examiner* — Peter M Albrecht
(74) *Attorney, Agent, or Firm* — Oliff PLC

(57) ABSTRACT

A magnetoresistance effect element includes a magnetic recording layer which includes a ferromagnetic material, a non-magnetic layer laminated on the magnetic recording layer, and a magnetization reference layer which is laminated on the non-magnetic layer. The magnetic recording layer includes a first ferromagnetic layer, a spacer layer, and a second ferromagnetic layer in order from the non-magnetic layer. The first ferromagnetic layer and the second ferromagnetic layer are antiferromagnetically coupled to each other. The magnetic recording layer has a central region in which a product of a film thickness and saturation magnetization of the first ferromagnetic layer is greater than a product of a film thickness and saturation magnetization of the second ferromagnetic layer, and an outer region in which the product of the film thickness and the saturation magnetization of the first ferromagnetic layer is smaller than the product of the film thickness and the saturation magnetization of the second ferromagnetic layer.

17 Claims, 15 Drawing Sheets

(51) Int. Cl.
 _H10B 61/00_ (2023.01)
 _H10N 50/01_ (2023.01)
 _H10N 50/85_ (2023.01)

(56) References Cited

U.S. PATENT DOCUMENTS

| | | | |
|---|---|---|---|
| 2010/0142264 | A1 | 6/2010 | Numata et al. |
| 2019/0363244 | A1 | 11/2019 | Sasaki et al. |
| 2020/0044141 | A1 | 2/2020 | Yamada et al. |

FOREIGN PATENT DOCUMENTS

| | | | |
|---|---|---|---|
| JP | 2019-204949 | A | 11/2019 |
| JP | 2020-021857 | A | 2/2020 |
| WO | 2007/020823 | A1 | 2/2007 |

MAGNETORESISTANCE EFFECT ELEMENT AND MAGNETIC RECORDING ARRAY

TECHNICAL FIELD

The present invention relates to a magnetoresistance effect element and a magnetic recording array.

Priority is claimed on Japanese Patent Application No. 2020-026411, filed on Feb. 19, 2020, the content of which is incorporated herein by reference.

BACKGROUND ART

The next-generation non-volatile memory is attracting attention as an alternative to a flash memory and the like of which miniaturization has reached the limit. For example, an MRAM (Magnetoresistive Random-Access Memory), a ReRAM (Resistive Random-Access Memory), a PCRAM (Phase-Change Random-Access Memory), and the like are known as next-generation non-volatile memories.

The MRAM uses the change in the resistance value, which is caused by a change in the orientation of magnetization, for data recording. Data recording is handled by each of magnetoresistance effect elements constituting the MRAM. For example, Patent Document 1 discloses a magnetoresistance effect element (magnetic domain wall moving element) capable of recording multi-valued data by moving a magnetic domain wall in a magnetic recording layer.

CITATION LIST

Patent Document

[Patent Document 1]
Japanese Patent No. 5206414

SUMMARY OF INVENTION

Technical Problem

The magnetic domain wall moving element has a resistance value that varies depending on the position of the magnetic domain wall, and records the change in the resistance value, as data. If the moving speed of the magnetic domain wall is slow, the variation of the resistance value becomes gradual. As a result, the gradation of data that can be recorded by one magnetic domain wall moving element increases, and the data change becomes analog. For example, in a neural network that imitates the human brain, analog data recording is required. If the saturation magnetization of the magnetic recording layer to which the magnetic domain wall moves increases, the moving speed of the magnetic domain wall slows down. On the other hand, the larger the saturation magnetization of the magnetic recording layer, the larger the leakage magnetic field from the magnetic domain wall moving element to the outside, and the greater the influence of the magnetic domain wall moving element on other elements. The problem of the leakage magnetic field having an influence on other elements is not only limited to the magnetic domain wall moving element, but also is a general problem of the magnetoresistance effect element.

The present invention has been made in view of the above problems, and an object of the present invention is to provide a magnetoresistance effect element and a magnetic recording array capable of reducing a leakage magnetic field.

Solution to Problem (1) According to a first aspect, a magnetoresistance effect element includes a magnetic recording layer which includes a ferromagnetic material, a non-magnetic layer which is laminated on the magnetic recording layer, and a magnetization reference layer which is laminated on the non-magnetic layer. The magnetic recording layer has a first ferromagnetic layer, a spacer layer, and a second ferromagnetic layer in order from the non-magnetic layer. The first ferromagnetic layer and the second ferromagnetic layer are antiferromagnetically coupled to each other. The magnetic recording layer has a central region in which a product of a film thickness and saturation magnetization of the first ferromagnetic layer is greater than a product of a film thickness and saturation magnetization of the second ferromagnetic layer, and an outer region in which the product of the film thickness and the saturation magnetization of the first ferromagnetic layer is smaller than the product of the film thickness and the saturation magnetization of the second ferromagnetic layer. The outer region is located outside the central region in a plan view from a laminating direction.

(2) In the magnetoresistance effect element according to the above aspect, the second ferromagnetic layer may project outward from the first ferromagnetic layer in a plan view from the laminating direction.

(3) In the magnetoresistance effect element according to the above aspect, the outer region may be located at an end portion in a first direction in which the magnetic recording layer extends.

(4) The magnetoresistance effect element according to the above aspect may further include a first conductive layer and a second conductive layer separated from each other in a first direction in which the magnetic recording layer extends and be connected to the magnetic recording layer, in which at least one portion of the first conductive layer and at least one portion of the second conductive layer may overlap the central region in a plan view from the laminating direction.

(5) The magnetoresistance effect element according to the above aspect may further include a first conductive layer and a second conductive layer separated from each other in a first direction in which the magnetic recording layer extends and be connected to the magnetic recording layer, in which the first conductive layer may overlap the outer region in a plan view from the laminating direction, and the second conductive layer may overlap the central region in a plan view from the laminating direction.

(6) In the magnetoresistance effect element according to the above aspect, the outer region may be located at an end portion in a second direction intersecting a first direction in which the magnetic recording layer extends.

(7) In the magnetoresistance effect element according to the above aspect, the outer region may be located at both an end portion in a first direction in which the magnetic recording layer extends and an end portion in a second direction intersecting the first direction.

(8) In the magnetoresistance effect element according to the above aspect, a portion of the outer region may not include the first ferromagnetic layer.

(9) In the magnetoresistance effect element according to the above aspect, the first ferromagnetic layer may have a first region having a film thickness as a first film thickness and a second region having a film thickness different from the first film thickness, and the second region is located outside the first region in a plan view from the laminating direction.

(10) In the magnetoresistance effect element according to the above aspect, the spacer layer may cover an entirety of a first surface of the second ferromagnetic layer on the first ferromagnetic layer side.

(11) In the magnetoresistance effect element according to the above aspect, a sidewall of the magnetic recording layer may be inclined with respect to the laminating direction, and sidewalls of the first ferromagnetic layer, the spacer layer, and the second ferromagnetic layer may be continuous.

(12) The magnetoresistance effect element according to the above aspect may further include a spin-orbit torque wiring being in contact with a surface of the magnetic recording layer on an opposite side of the non-magnetic layer.

(13) In the magnetoresistance effect element according to the above aspect, the outer region may be located at an end portion in a direction different from a direction in which the spin-orbit torque wiring extends.

(14) In the magnetoresistance effect element according to the above aspect, a length from a boundary between the outer region and the central region to an end portion of the outer region may be equal to or smaller than 10 times a film thickness of the first ferromagnetic layer in the central region.

(15) In the magnetoresistance effect element according to the above aspect, the first ferromagnetic layer may be consists of a plurality of layers, the plurality of layers may include a plurality of ferromagnetic layers and a second spacer layer between the plurality of ferromagnetic layers, and the plurality of ferromagnetic layers may be antiferromagnetically coupled to each other.

(16) The magnetoresistance effect element according to the above aspect may further include a magnetic domain wall inside the magnetic recording layer.

(17) According to a second aspect, a magnetic recording array includes a plurality of the magnetoresistance effect elements according to the above aspect.

Advantageous Effects of Invention

According to the aspects, the magnetoresistance effect element and the magnetic recording array have a small leakage magnetic field.

DESCRIPTION OF EMBODIMENTS

Hereinafter, the present embodiment will be described in detail with reference to the drawings as appropriate. The drawings used in the following description may be enlarged for convenience in order to make the features of the present invention easy to understand, and the dimensional ratios and the like of each component may differ from the actual ones. The materials, the dimensions, and the like exemplified in the following description are examples, although the present invention is not limited thereto. The present invention can be appropriately changed and carried out within a range in which the effects of the present invention are exhibited.

First, directions are defined. An x-direction and a y-direction are directions substantially parallel to one surface of a substrate Sub (see FIG. 2) described later. The x-direction is a direction in which a magnetic recording layer 10 described later extends, and is a direction toward a second conductive layer 50 from a first conductive layer 40 described later. The x-direction is an example of a first direction. The y-direction is a direction perpendicular to the x-direction. The y-direction is an example of a second direction.

A z-direction is a direction toward a magnetoresistance effect element 100 from the substrate Sub described later. The z-direction coincides with, for example, a laminating direction of the magnetic recording layer 10. Further, in the present specification, "extending in the x-direction" means, for example, that the dimension in the x-direction is larger than the smallest dimension among the dimensions in the x-direction, the y-direction, and the z-direction. This is similarly applied to cases of extending in other directions.

First Embodiment

Figure 1:
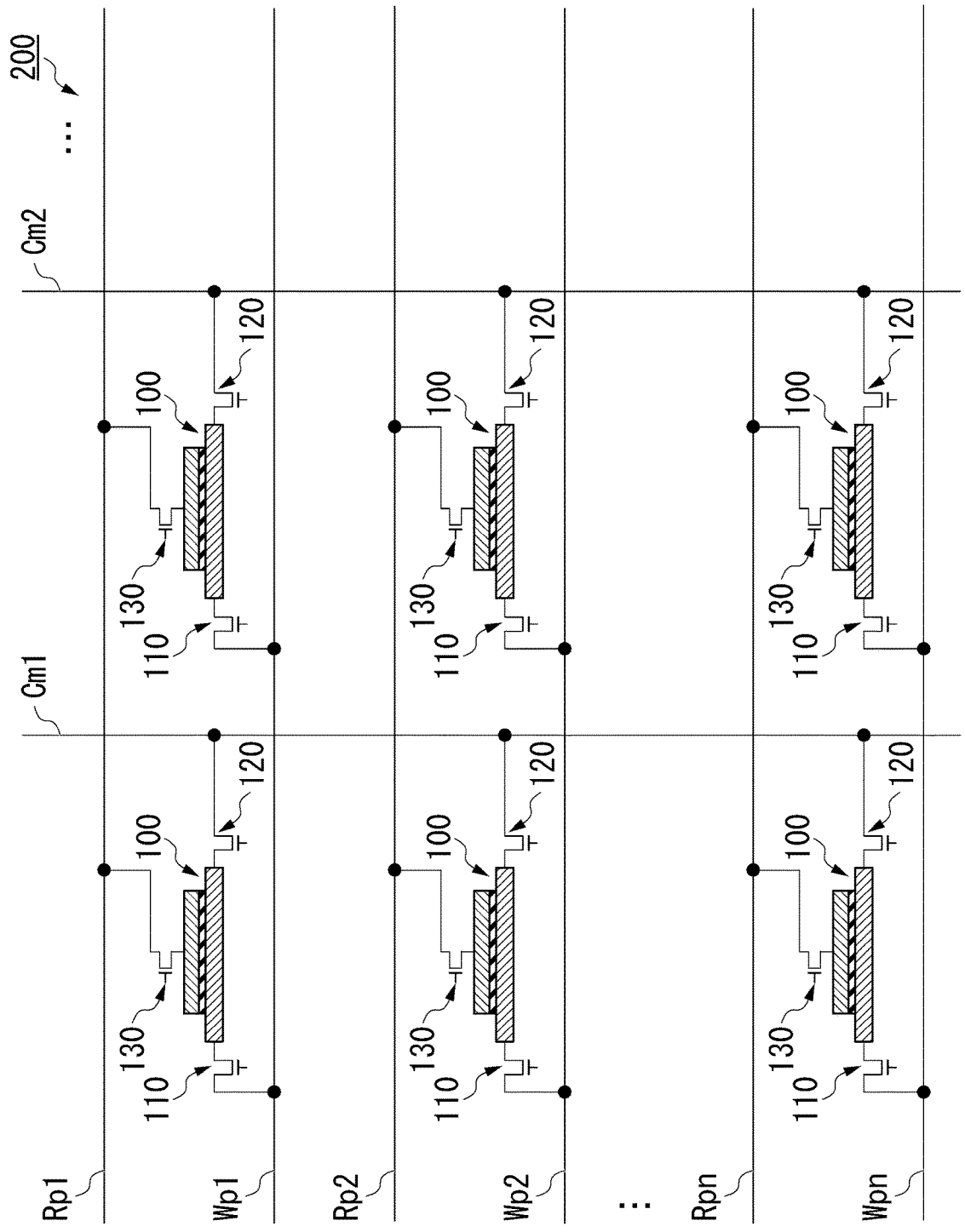
FIG. 1 is a configuration diagram of a magnetic recording array according to a first embodiment.

FIG. 1 is a configuration diagram of a magnetic recording array according to a first embodiment. A magnetic recording array 200 includes a plurality of magnetoresistance effect elements 100, a plurality of first wirings Wp1 to Wpn, a plurality of second wirings Cm1 to Cmn, a plurality of third wirings Rp1 to Rpn, a plurality of first switching elements 110, a plurality of second switching elements 120, and a plurality of third switching elements 130. The magnetic recording array 200 can be used, for example, in a magnetic memory, a multiply-accumulate calculator, and a neuromorphic device.

<First Wiring, Second Wiring, and Third Wiring>

The first wirings Wp1 to Wpn are write wirings. The first wirings Wp1 to Wpn electrically connect a power supply and one or more magnetoresistance effect elements 100. The power supply is connected to one end of the magnetic recording array 200 during use.

The second wirings Cm1 to Cmn are common wirings. A common wiring is a wiring that can be used at both times of writing data and reading data. The second wirings Cm1 to Cmn electrically connect a reference potential and one or more magnetoresistance effect elements 100. The reference potential is, for example, the ground. The second wirings Cm1 to Cmn may be provided in each of the plurality of magnetoresistance effect elements 100, or may be provided across the plurality of magnetoresistance effect elements 100.

The third wirings Rp1 to Rpn are read wirings. The third wirings Rp1 to Rpn electrically connect the power supply and one or more magnetoresistance effect elements 100. The power supply is connected to one end of the magnetic recording array 200 during use.

<First Switching Element, Second Switching Element, and Third Switching Element>

The first switching element 110, the second switching element 120, and the third switching element 130 represented in FIG. 1 are connected to each of the plurality of magnetoresistance effect elements 100. The first switching elements 110 are connected between the magnetoresistance effect elements 100 and each of the first wirings Wp1 to Wpn. The second switching elements 120 are connected between the magnetoresistance effect elements 100 and each of the second wirings Cm1 to Cmn. The third switching elements 130 are connected between the magnetoresistance effect elements 100 and each of the third wirings Rp1 to Rpn.

When the first switching element 110 and the second switching element 120 are turned ON, a write current flows between the first wirings Wp1 to Wpn and the second wirings Cm1 to Cmn, which are connected to the predetermined magnetoresistance effect element 100. When the second switching element 120 and the third switching element 130 are turned ON, a read current flows between the second wirings Cm1 to Cmn and the third wirings Rp1 to Rpn, which are connected to the predetermined magnetoresistance effect element 100.

The first switching element 110, the second switching element 120, and the third switching element 130 are elements that control the flow of the current. The first switching element 110, the second switching element 120, and the third switching element 130 are, for example, a transistor, an element such as an Ovonic Threshold Switch (OTS), which uses a phase change of a crystal layer, an element such as a metal-insulator transition (MIT) switch, which uses a change in band structure, an element such as a Zener diode and an avalanche diode, which use a breakdown voltage, and an element having conductivity that changes with a change of atomic position.

Any one of the first switching element 110, the second switching element 120, and the third switching element 130 may be shared by the magnetoresistance effect element 100 connected to the same wiring. For example, when the first switching element 110 is intended to be shared, one first switching element 110 is provided on an upstream side of the first wiring Wp1 to Wpn. For example, when the second switching element 120 is intended to be shared, one second switching element 120 is provided on an upstream side of the second wirings Cm1 to Cmn. For example, when the third switching element 130 is intended to be shared, one third switching element 130 is provided on an upstream side of the third wiring Rp1 to Rpn.

Figure 2:
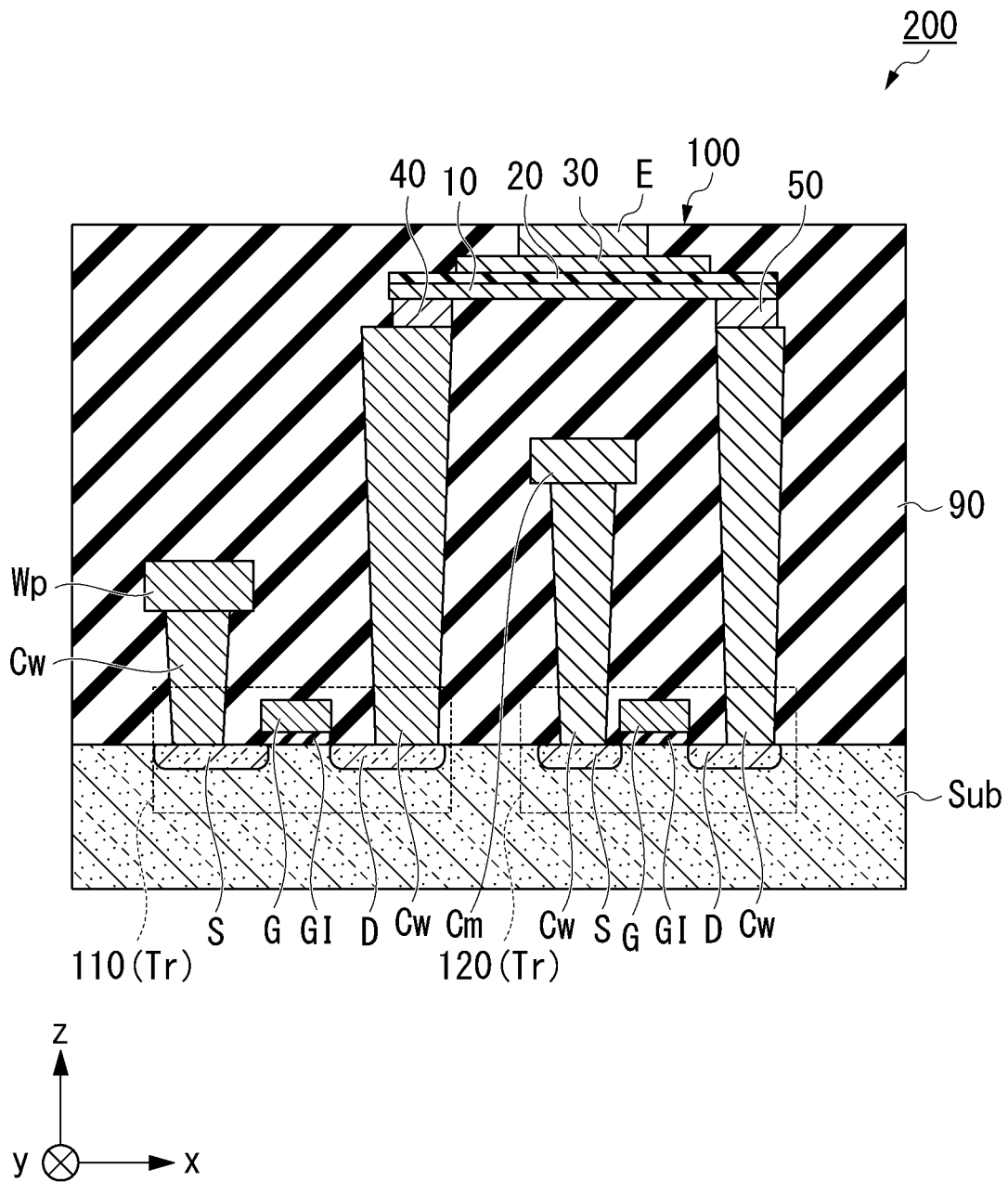
FIG. 2 is a cross-sectional view of a characteristic portion of the magnetic recording array according to the first embodiment.

FIG. 2 is a cross-sectional view of a main portion of the magnetic recording array 200 according to the first embodiment. FIG. 2 represents a cross section obtained by cutting one magnetoresistance effect element 100 in FIG. 1 along an xz plane passing through the center of the width of the magnetic recording layer 10 in the y-direction.

The first switching element 110 and the second switching element 120 represented in FIG. 2 are transistors Tr. The transistor Tr has a gate electrode G, a gate insulating film GI, and a source region S and a drain region D formed in the substrate Sub. The substrate Sub is, for example, a semiconductor substrate. The third switching element 130 is electrically connected to an electrode E and is located, for example, in the y-direction.

Each of the transistors Tr is electrically connected to the magnetoresistance effect element 100 via a connection wiring Cw. The connection wiring Cw contains a material having conductivity. The connection wiring Cw extends in the z-direction, for example. The connection wiring Cw is, for example, a via wiring formed in an opening portion of an insulating layer 90.

The magnetoresistance effect element 100 and the transistor Tr are electrically isolated from each other by the insulating layer 90 except for the connection wiring Cw. The insulating layer 90 is an insulating layer that performs insulating between the wirings of a multilayer wiring and between the elements. The insulating layer 90 is made of, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), and the like.

"Magnetoresistance Effect Element"

Figure 3:
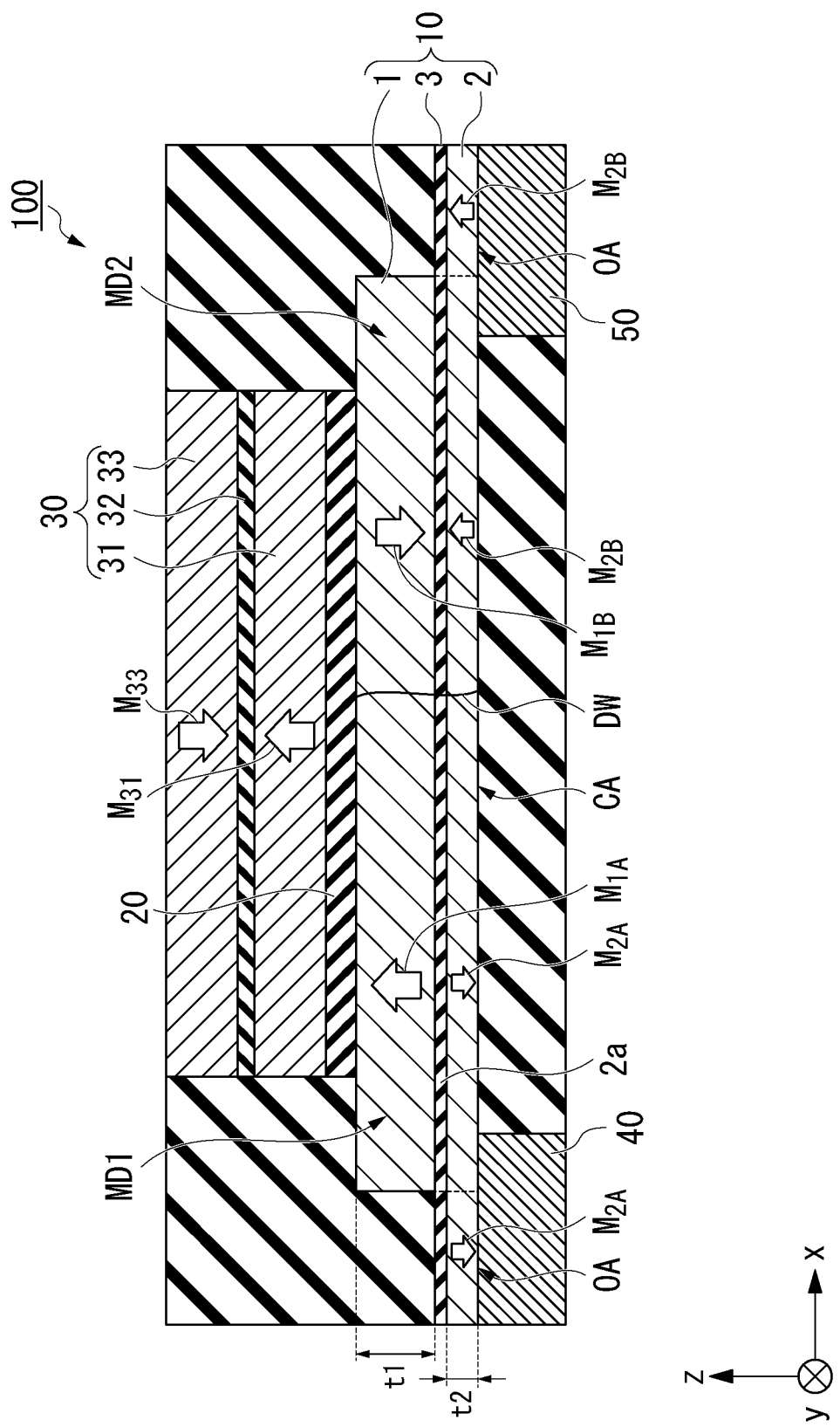
FIG. 3 is a cross-sectional view of a magnetoresistance effect element according to the first embodiment.
Figure 4:
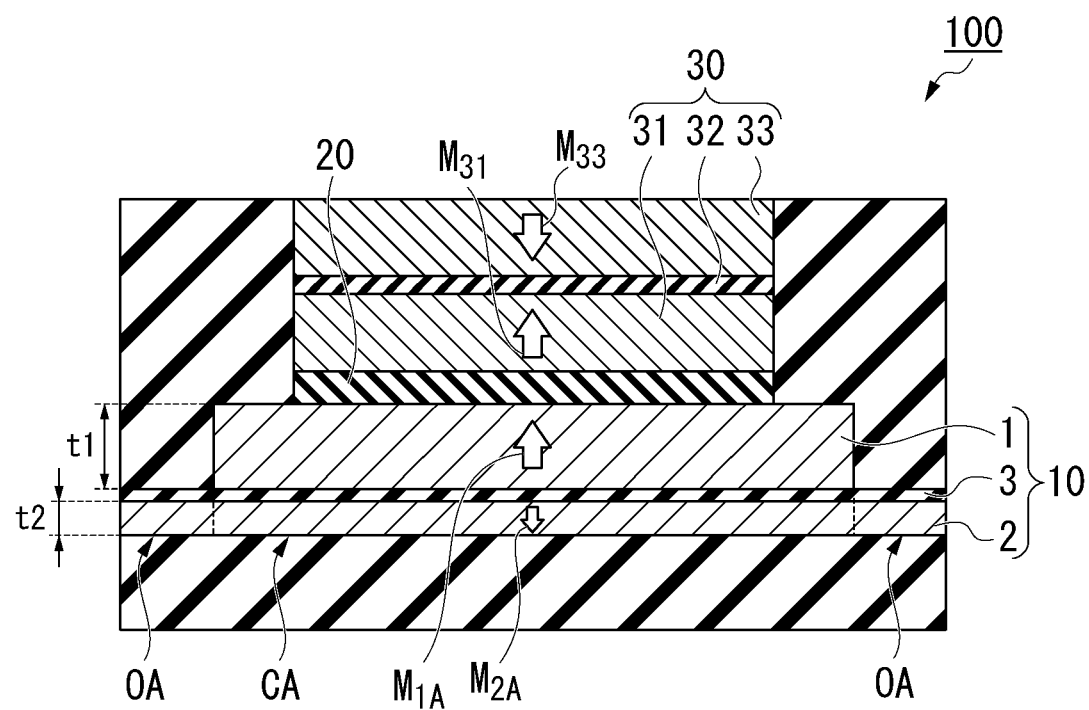
FIG. 4 is a cross-sectional view of the magnetoresistance effect element according to the first embodiment.
Figure 4:
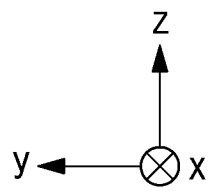
Figure 5:
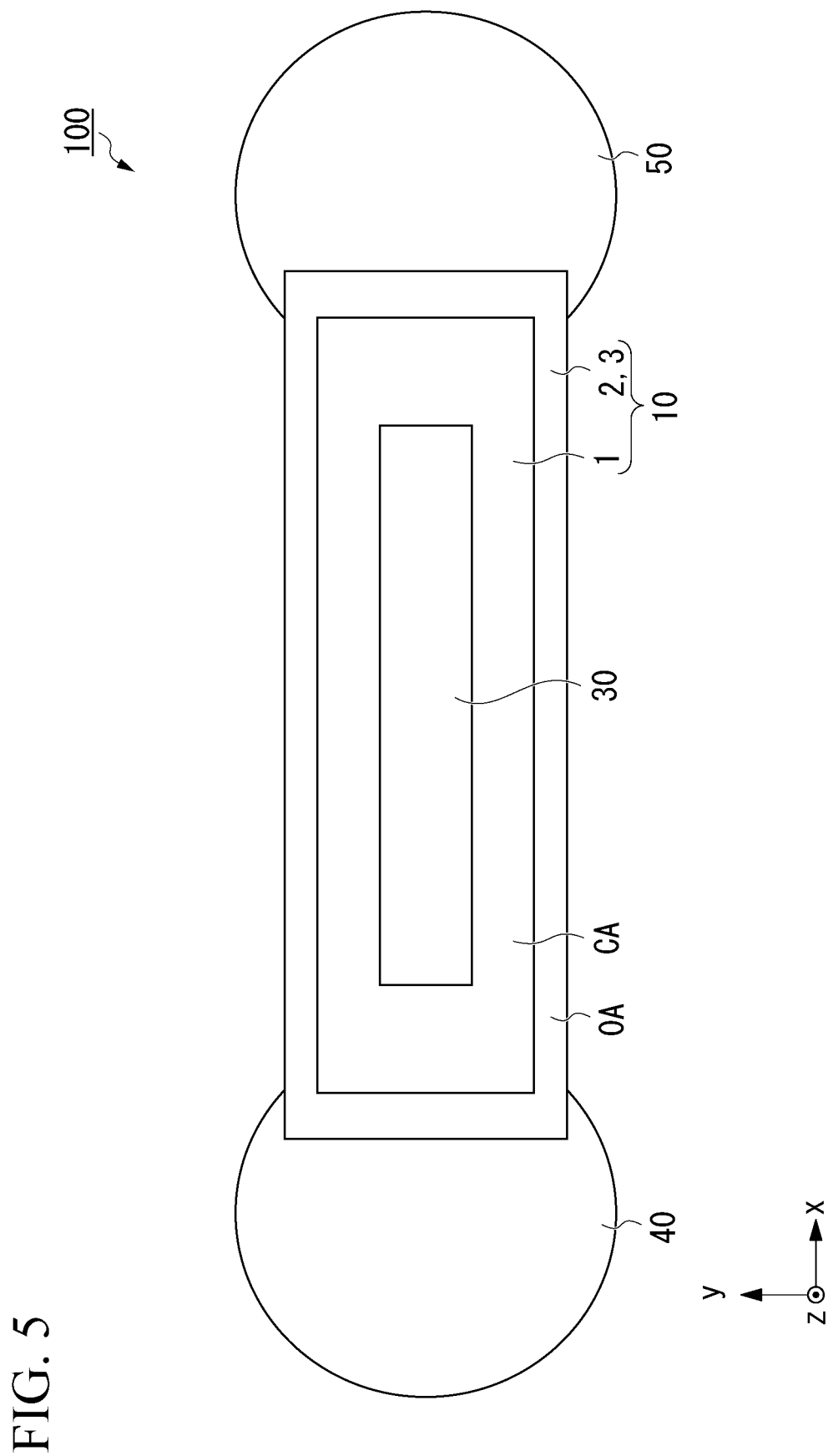
FIG. 5 is a plan view of the magnetoresistance effect element according to the first embodiment.

FIG. 3 is a cross-sectional view obtained by cutting the magnetoresistance effect element 100 along the xz plane passing through the center of the magnetic recording layer 10 in the y-direction. FIG. 4 is a cross-sectional view obtained by cutting the magnetoresistance effect element 100 along a yz plane passing through the center of the magnetic recording layer 10 in the x-direction. FIG. 5 is a plan view of the magnetoresistance effect element 100 in a plan view from the z-direction. The magnetoresistance effect element 100 represented in FIGS. 3 to 5 is a magnetic domain wall moving element capable of having a magnetic domain wall DW inside the magnetic recording layer 10.

The magnetoresistance effect element 100 includes the magnetic recording layer 10, a non-magnetic layer 20, a magnetization reference layer 30, a first conductive layer 40, and a second conductive layer 50. The magnetoresistance effect element 100 is covered with the insulating layer 90.

When data is written in the magnetoresistance effect element 100, a write current flows through the magnetic recording layer 10 between the first conductive layer 40 and the second conductive layer 50. When data is read from the magnetoresistance effect element 100, a read current flows between the first conductive layer 40 or the second conductive layer 50, and the magnetization reference layer 30.

"Magnetic Recording Layer" The magnetic recording layer 10 extends in the x-direction. A write current flows through the magnetic recording layer 10 when data is written. The magnetic recording layer 10 is a layer capable of magnetically recording information by changing the internal magnetic state. The magnetic recording layer 10 may be referred to as a ferromagnetic layer or a magnetic domain wall moving layer.

The magnetic recording layer 10 includes a magnetic domain wall DW inside. The magnetic domain wall DW is a boundary between a first magnetic domain MD1 and a second magnetic domain MD2. The first magnetic domain MD1 is, for example, a region on the first conductive layer 40 side from the magnetic domain wall DW in the magnetic recording layer 10. The second magnetic domain MD2 is, for example, a region on the second conductive layer 50 side from the magnetic domain wall DW in the magnetic recording layer 10. The magnetizations $M_{1A}$ and $M_{2A}$ of the first magnetic domain MD1 and the magnetizations $M_{1B}$ and $M_{2B}$ of the second magnetic domain MD2 are oriented in different directions. The magnetizations $M_{1A}$ and $M_{2A}$ of the first magnetic domain MD1 and the magnetizations $M_{1B}$ and $M_{2B}$ of the second magnetic domain MD2 are oriented in opposite directions, for example.

When the magnetic domain wall DW moves, the ratio between the first magnetic domain MD1 and the second magnetic domain MD2 in the magnetic recording layer 10 changes. The magnetic domain wall DW moves by causing a write current to flow in the x-direction of the magnetic recording layer 10. For example, when a write current (for example, a current pulse) in the +x direction is applied to the magnetic recording layer 10, electrons flow in the −x direction opposite to the current, and the magnetic domain wall DW moves in the −x direction. When a current flows from the first magnetic domain MD1 to the second magnetic domain MD2, electrons spin-polarized in the second magnetic domain MD2 invert the magnetizations $M_{1A}$ and $M_{2A}$ of the first magnetic domain MD1. The magnetic domain wall DW moves in the −x direction by inverting the magnetization of the magnetizations $M_{1A}$ and $M_{2A}$ of the first magnetic domain MD1.

When the ratio between the first magnetic domain MD1 and the second magnetic domain MD2 in the magnetic recording layer 10 changes, the resistance value of the magnetoresistance effect element 100 changes. The resistance value of the magnetoresistance effect element 100 changes depending on the relative angle between the magnetizations of the ferromagnetic layers sandwiching the non-magnetic layer 20. In the case of the magnetoresistance effect element 100 represented in FIG. 3, the resistance value of the magnetoresistance effect element 100 changes depending on the relative angle between the magnetizations $M_{1A}$ and $M_{1B}$ of the first ferromagnetic layer 1 and the magnetization $M_{31}$ of the ferromagnetic layer 31. When the ratio of the first magnetic domain MD1 increases, the resistance value of the magnetoresistance effect element 100 decreases. When the ratio of the second magnetic domain MD2 increases, the resistance value of the magnetoresistance effect element 100 increases.

The magnetic recording layer 10 includes the first ferromagnetic layer 1, the spacer layer 3, and the second ferromagnetic layer 2 in order from the non-magnetic layer 20 side. The spacer layer 3 is sandwiched between the first ferromagnetic layer 1 and the second ferromagnetic layer 2.

The magnetizations $M_{1A}$ and $M_{1B}$ of the first ferromagnetic layer 1 are antiferromagnetically coupled with the magnetizations $M_{2A}$ and $M_{2B}$ of the second ferromagnetic layer via the spacer layer 3, respectively.

The magnetic recording layer 10 has a central region CA and an outer region OA. The outer region OA is outside the central region CA. The outer region OA in the magnetic recording layer 10 represented in FIGS. 3 to 5 is outside both the x-direction and the y-direction of the central region CA.

The outer region OA is, for example, outside the central region CA in the x-direction. For example, the end portion of the magnetic recording layer 10 in the x-direction is included in the outer region OA. When the outer region OA is outside the central region CA in the x-direction, a reflux magnetic domain is formed in the x-direction, and making a single magnetic domain of the magnetic recording layer 10 is prevented. The reflux magnetic domain is formed by the magnetization $M_{2A}$ or magnetization $M_{2B}$ in the outer region OA, and the difference between the magnetization $M_{1A}$ and the magnetization $M_{2A}$ or the difference between the magnetization $M_{1B}$ and the magnetization $M_{2B}$ in the central region CA.

Further, the outer region OA is, for example, outside the central region CA in the y-direction. For example, the end portion of the magnetic recording layer 10 in the y-direction is included in the outer region OA. When the outer region OA is outside the central region CA in the y-direction, a reflux magnetic domain is formed in the y-direction. The reflux magnetic domain stabilizes the magnetization of the magnetic recording layer 10 and enhances the data retention performance.

The central region CA is a region in which the product of the film thickness t1 and the saturation magnetization of the first ferromagnetic layer 1 is greater than the product of the film thickness t2 and the saturation magnetization of the second ferromagnetic layer 2. The outer region OA is a region in which the product of the film thickness t1 and the saturation magnetization of the first ferromagnetic layer 1 is smaller than the product of the film thickness t2 and the saturation magnetization of the second ferromagnetic layer 2. The film thicknesses t1 and t2 of the first ferromagnetic layer 1 and the second ferromagnetic layer 2 are average values in the XY plane.

It is difficult to measure the saturation magnetization of each layer incorporated in the magnetoresistance effect element 100. Therefore, the saturation magnetization of the ferromagnetic layer can be evaluated by forming a film having a similar structure on a flat plate.

In the central region CA, the film thickness t1 of the first ferromagnetic layer 1 is thicker than, for example, the film thickness t2 of the second ferromagnetic layer 2. In the central region CA, the film thickness t1 of the first ferromagnetic layer 1 is, for example, equal to or more than twice the film thickness t2 of the second ferromagnetic layer 2. In the outer region OA, the second ferromagnetic layer 2 projects outward from the first ferromagnetic layer 1 in a plan view from the z-direction. For example, the length L10 from the boundary between the outer region OA and the central region CA to the end portion of the outer region OA is equal to or smaller than 10 times the film thickness t1 of the first ferromagnetic layer 1 in the central region CA. For example, in a plan view from the z-direction, the amount of protrusion of the second ferromagnetic layer 2 from the first ferromagnetic layer 1 is equal to or smaller than 10 times the film thickness t1 of the first ferromagnetic layer 1 in the central region CA. As the amount of protrusion of the outer region OA with respect to the central region CA increases, the leakage magnetic field from the outer region OA increases. In FIG. 3, the outer region OA does not include the first ferromagnetic layer 1 and is configured by the spacer layer 3 and the second ferromagnetic layer 2. When the outer region OA does not include the first ferromagnetic layer 1, the film thickness of the first ferromagnetic layer 1 in the outer region OA is handled as zero.

The first ferromagnetic layer 1 and the second ferromagnetic layer 2 contain a magnetic material. The first ferromagnetic layer 1 and the second ferromagnetic layer 2 may be a single ferromagnetic layer or a laminated body in which a plurality of ferromagnetic layers are ferromagnetically coupled to each other. The first ferromagnetic layer 1 and the second ferromagnetic layer 2 have at least one element selected from the group consisting of, for example, Fe, Co, Ni, Pt, Pd, Gd, Tb, Mn, Ge, and Ga. The first ferromagnetic layer 1 and the second ferromagnetic layer 2 are, for example, a laminated film of CoFe and Pt, a laminated film of CoFe and Pd, a laminated film of Co and Ni, a laminated film of Co and Pt, a laminated film of Co and Pd, a MnGa-based material, a GdCo-based material, or a TbCo-based material. The ferrimagnetic material such as the MnGa-based material, the GdCo-based material, and the TbCo-based material has a small saturation magnetization, and a threshold current required to move the magnetic domain wall DW is small. The laminated film of CoFe and Pt, the laminated film of CoFe and Pd, the laminated film of Co and Ni, the laminated film of Co and Pt, and the laminated film of Co and Pd have a large coercive force, and the moving speed of the magnetic domain wall DW becomes slow. A material similar to the material of the ferromagnetic layer 31, which will be described later, can be applied to the first ferromagnetic layer 1 and the second ferromagnetic layer 2.

The spacer layer 3 is made of a non-magnetic material. The spacer layer 3 is made of, for example, Ru, Ir, or Rh. The spacer layer 3 covers, for example, the entirety of the first surface 2a of the second ferromagnetic layer 2. When the spacer layer 3 covers the entirety of the first surface 2a of the second ferromagnetic layer 2, the second ferromagnetic layer 2 is protected from process damage by the spacer layer 3.

"Non-magnetic Layer" The non-magnetic layer 20 is located between the magnetic recording layer 10 and the magnetization reference layer 30. The non-magnetic layer 20 is laminated on one surface of the magnetic recording layer 10.

The non-magnetic layer 20 is made of, for example, a non-magnetic insulator, a non-magnetic semiconductor, or non-magnetic metal. The non-magnetic insulator is, for example, $Al_2O_3$, $SiO_2$, MgO, $MgAl_2O_4$, and a material in which some of Al, Si, and Mg are replaced with Zn, Be, or the like. The materials have a large bandgap and excellent insulation. When the non-magnetic layer 20 is made of a non-magnetic insulator, the non-magnetic layer 20 is a tunnel barrier layer. The non-magnetic metal is, for example, Cu, Au, Ag or the like. The non-magnetic semiconductor is, for example, Si, Ge, $CuInSe_2$, $CuGaSe_2$, Cu (In, Ga)$Se_2$, and the like.

The thickness of the non-magnetic layer 20 is, for example, equal to or greater than 20 Å, and may be equal to or greater than 25 Å. When the thickness of the non-magnetic layer 20 is thick, the resistance area product (RA) of the magnetoresistance effect element 100 is large. The resistance area product (RA) of the magnetoresistance effect element 100 is preferably equal to or greater than $1 \times 10^4 \Omega \mu m^2$, and more preferably equal to or more greater than $5 \times 10^4 \Omega \mu m^2$. The resistance area product (RA) of the magnetoresistance effect element 100 is represented by the product of the element resistance of one magnetoresistance effect element 100 and the element cross-sectional area (the area of a cut surface obtained by cutting the non-magnetic layer 20 in the xy plane) of the magnetoresistance effect element 100.

"Magnetization Reference Layer"

The magnetization reference layer 30 is laminated on the non-magnetic layer 20. The magnetization reference layer 30 overlaps with the central region CA in a plan view from the z-direction, for example. A leakage magnetic field is easily generated near the outer region OA as compared with the central region CA. By overlapping the magnetization reference layer 30 with the central region CA, it is possible to suppress the influence of a leakage magnetic field on the magnetization reference layer 30.

The magnetization reference layer 30 is configured by, for example, a ferromagnetic layer 31, an intermediate layer 32, and a ferromagnetic layer 33. The magnetization $M_{31}$ of the ferromagnetic layer 31 and the magnetization $M_{33}$ of the ferromagnetic layer 33 are antiferromagnetically coupled to each other.

The ferromagnetic layer 31 contains a ferromagnet. The ferromagnetic layer 31 contains, for example, a material that easily obtains a coherent tunneling effect with the magnetic recording layer 10. For example, the ferromagnetic layer 31 contains metal selected from the group consisting of Cr, Mn, Co, Fe, and Ni, an alloy including one or more of the above kinds of metal, an alloy including the above kinds of metal and an element of at least one or more kinds of B, C, and N. The ferromagnetic layer 31 is made of, for example, Co—Fe, Co—Fe—B, or Ni—Fe.

The ferromagnetic layer 31 may be made of, for example, a Heusler alloy. The Heusler alloy is half metal and has high spin polarizability. The Heusler alloy is an intermetallic compound having a chemical composition of XYZ or $X_2YZ$, where X is a transition metal element of the Co, Fe, Ni, or Cu group or noble metal element on the periodic table, Y is a transition metal of the Mn, V, Cr, or Ti group or an elemental species of X, and Z is a typical element of Group III to Group V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like.

The intermediate layer 32 is a non-magnetic layer. The intermediate layer 32 is made of, for example, Ru, Jr, or Rh.

The ferromagnetic layer 33 is antiferromagnetically coupled with the ferromagnetic layer 31. For the ferromagnetic layer 33, a similar material to the material of the first ferromagnetic layer 1 and the second ferromagnetic layer 2, and the ferromagnetic layer 31 can be applied. The ferromagnetic layer 33 can also be combined with an antiferromagnet such as IrMn or PtMn.

The product of the film thickness and the saturation magnetization of the ferromagnetic layer 31 is substantially equal to the product of the film thickness and the saturation magnetization of the ferromagnetic layer 33. The film thickness of the ferromagnetic layer 31 and the film thickness of the ferromagnetic layer 33 are, for example, equal to each other. The magnetization reference layer 30 has a synthetic antiferromagnetic structure.

The ferromagnetic layer 31 has a magnetization $M_{31}$ oriented in one direction. The magnetization $M_{31}$ of the ferromagnetic layer 31 is less likely to be magnetized and inverted than the magnetizations $M_{1A}$ and $M_{1B}$ of the first ferromagnetic layer 1 when a predetermined external force is applied. The predetermined external force is, for example, an external force applied to the magnetization by an external magnetic field or an external force applied to the magnetization by a spin polarization current.

The direction of the magnetization of each layer of the magnetoresistance effect element 100 can be checked, for example, by measuring a magnetization curve. The magnetization curve can be measured by using, for example, MOKE (Magneto Optical Kerr Effect). The measurement by MOKE is a measurement method performed by using a magneto-optical effect (magnetic Kerr effect) in which linearly polarized light is caused to be incident to a measurement target to cause rotation and the like in the polarization direction.

"First Conductive Layer and Second Conductive Layer"

The first conductive layer 40 and the second conductive layer 50 are connected to the magnetic recording layer 10. The first conductive layer 40 and the second conductive layer 50 may be connected to the same surface or different surfaces of the magnetic recording layer 10. The second conductive layer 50 is separated from the first conductive layer 40 and connected to the magnetic recording layer 10. In a plan view from the z-direction, the first conductive layer 40 and the second conductive layer 50 sandwich the geometric center of the magnetic recording layer 10 in the x-direction. The first conductive layer 40 is connected to, for example, a first end portion of the magnetic recording layer 10, and the second conductive layer 50 is connected to, for example, a second end portion of the magnetic recording layer 10. The first conductive layer 40 and the second conductive layer 50 are, for example, electrodes that connect the connection wiring Cw and the magnetic recording layer 10. The first conductive layer 40 and the second conductive layer 50 contain a conductor and may include a ferromagnetic material.

At least a portion of the first conductive layer 40 and at least a portion of the second conductive layer 50 overlaps the central region CA, for example, in a plan view from the z-direction. When the thickness of the magnetic recording layer 10 is thin, the moving speed of the magnetic domain wall DW is high. When the first conductive layer 40 and the second conductive layer 50 overlap the central region CA in the z-direction, a current flows in the first conductive layer 40 and the second conductive layer 50 before reaching the outer region OA in which the thickness of the magnetic recording layer 10 is thin. As a result, it is possible to avoid an occurrence of a situation in which the magnetic domain wall DW moves rapidly, and it is possible to avoid an occurrence of a situation in which the magnetic recording layer 10 is made to have a single magnetic domain.

Next, a method of manufacturing the magnetic recording array 200 will be described. The magnetic recording array 200 is formed by a laminating step of each layer and a processing step of processing a portion of each layer into a predetermined shape. For laminating of each layer, a sputtering method, a chemical vapor deposition (CVD) method, an electron beam vapor deposition method (EB vapor deposition method), an atomic laser deposit method, or the like can be used. Processing of each layer can be performed by using photolithography or the like.

First, impurities are doped at predetermined positions on a substrate Sub to form a source region S and a drain region D. Then, a gate insulating film GI and a gate electrode G are formed between the source region S and the drain region D. The source region S, the drain region D, the gate insulating film GI, and the gate electrode G form a transistor Tr.

Then, an insulating layer 90 is formed to cover the transistor Tr. Further, a connection wiring Cw is formed by forming an opening portion in the insulating layer 90 and filling the opening portion with a conductor. A first wiring Wp and a second wiring Cm are formed by laminating the insulating layer 90 to a predetermined thickness, and then forming a groove in the insulating layer 90, and filling the groove with a conductor.

A first conductive layer 40 and a second conductive layer 50 can be formed, for example, in a manner such that a conductive layer is laminated on one surface of the insulating layer 90 and the connection wiring Cw, and portions other than portions functioning as the first conductive layer 40 and the second conductive layer 50 are removed. The removed portions are buried in the insulating layer 90.

Then, a magnetic recording layer 10, a non-magnetic layer 20, and a magnetization reference layer 30 are laminated in this order, on the first conductive layer 40, the second conductive layer 50, and the insulating layer 90. Then, by processing the non-magnetic layer 20 and the magnetization reference layer 30 into predetermined shapes, a magnetoresistance effect element 100 can be obtained.

In the magnetoresistance effect element 100 according to the first embodiment, a magnetic field generated in the outer region OA weakens a leakage magnetic field generated from the central region CA.

Figure 6:
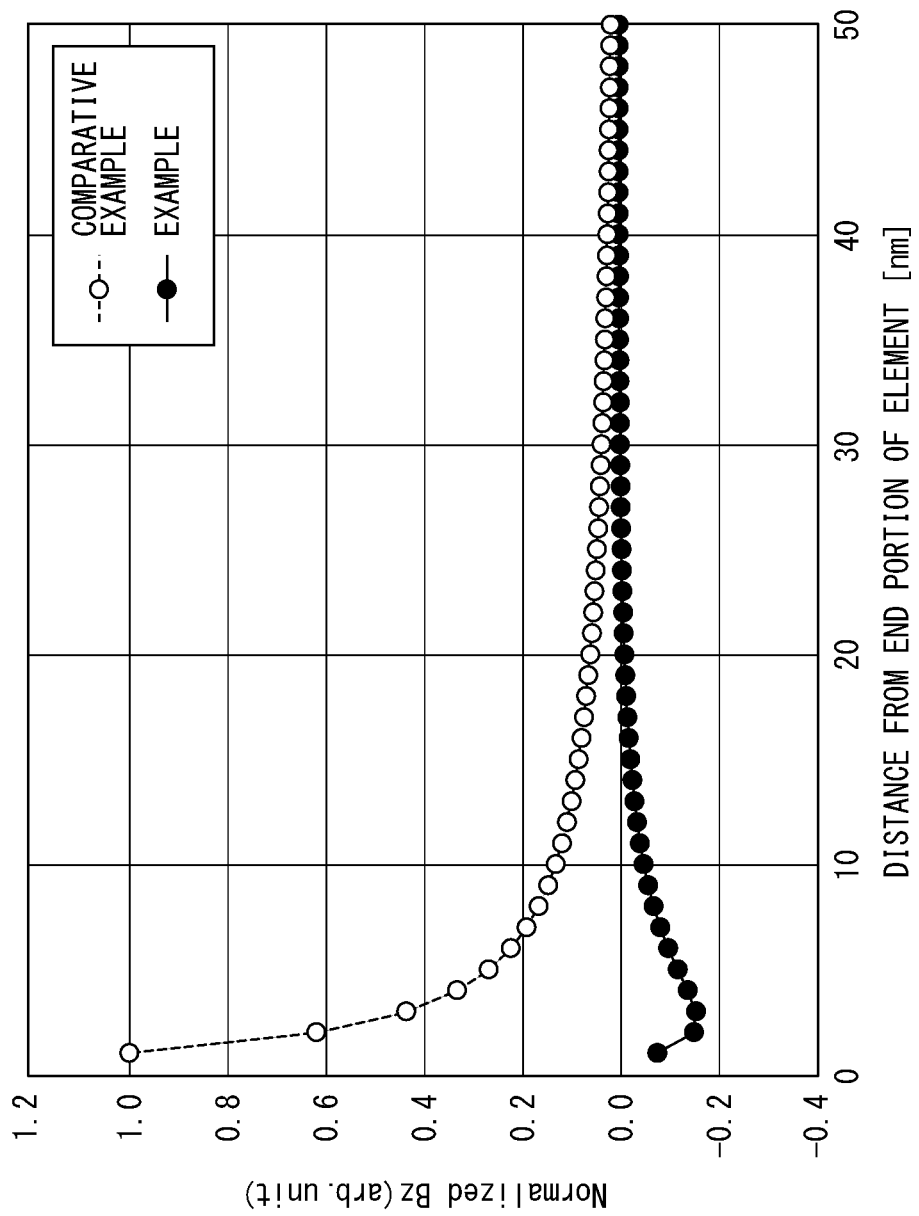
FIG. 6 is a diagram comparing a magnitude of a leakage magnetic field of a magnetoresistance effect element according to an example with a magnitude of a leakage magnetic field of a magnetoresistance effect element according to a comparative example.

FIG. 6 is a diagram comparing the magnitude of the leakage magnetic field of the magnetoresistance effect element according to an example with the magnitude of the leakage magnetic field of a magnetoresistance effect element according to a comparative example. The horizontal axis in FIG. 6 indicates the distance from the end portion of the magnetoresistance effect element. The vertical axis in FIG. 6 indicates the normalized magnetic flux density in the z-direction.

The magnetoresistance effect element according to the example is the magnetoresistance effect element 100 represented in FIGS. 3 to 5. On the other hand, the magnetoresistance effect element according to the comparative example is different from the magnetoresistance effect element according to the embodiment in that the magnetoresistance effect element according to the comparative example does not have the outer region. In the magnetoresistance effect element according to the comparative example, the second ferromagnetic layer 2 does not project outward from the first ferromagnetic layer 1 in a plan view from the z-direction. In the magnetoresistance effect element according to the comparative example, the product of the film thickness t1 and the saturation magnetization of the first ferromagnetic layer 1 is greater than the product of the film thickness t2 and the saturation magnetization of the second ferromagnetic layer 2 at all positions in the x-direction and the y-direction.

As represented in FIG. 6, in the magnetoresistance effect element according to the example, the leakage magnetic field is suppressed as compared with the magnetoresistance effect element according to the comparative example.

As described above, the magnetoresistance effect element 100 according to the first embodiment has a small leakage magnetic field, and thus it is possible to bring other elements close to the magnetoresistance effect element 100. If the distance between the adjacent magnetoresistance effect elements 100 can be reduced, it is possible to enhance the integration of the magnetic recording array 200.

Although an example of the magnetic recording array 200 and the magnetoresistance effect element 100 according to the first embodiment has been described in detail, the magnetic recording array 200 and the magnetoresistance effect element 100 according to the first embodiment can be variously modified and changed within the scope of the gist of the present invention.

For example, the outer region OA may be located only in the x-direction of the central region CA, or may be located only in the y-direction of the central region CA.

First Modification Example

Figure 7:
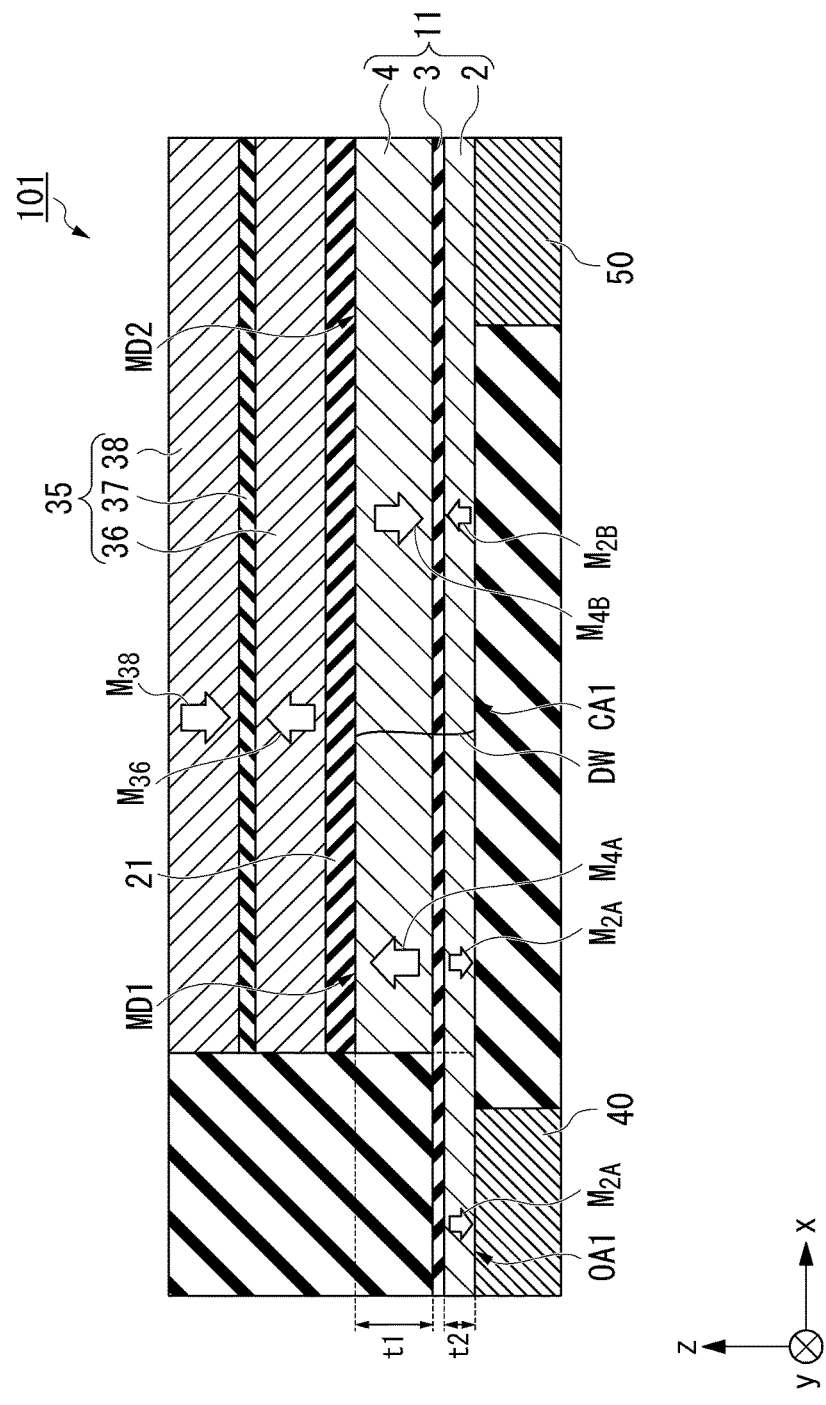
FIG. 7 is a cross-sectional view of a magnetoresistance effect element according to a first modification example.

FIG. 7 is a cross-sectional view obtained by cutting a magnetoresistance effect element 101 according to a first modification example in the xz plane passing through the center of a magnetic recording layer 11 in the y-direction. The magnetoresistance effect element 101 differs from the magnetoresistance effect element 100 in that the first conductive layer 40 does not overlap the central region CA1 but overlaps the outer region OA1 in a plan view from the z-direction. In FIG. 7, description of similar components to those in FIG. 3 is omitted.

The magnetic recording layer 11 includes a first ferromagnetic layer 4, the spacer layer 3, and the second ferromagnetic layer 2. The magnetic recording layer 11 is different from the magnetic recording layer 10 represented in FIG. 3 in that the first ferromagnetic layer 4 overlaps the second conductive layer 50 in a plan view from the z-direction. A non-magnetic layer 21 and a magnetization reference layer 35 are different from the non-magnetic layer 20 and the magnetization reference layer 30 represented in FIG. 3 in that the non-magnetic layer 21 and a magnetization reference layer 35 overlap the second conductive layer 50 in a plan view from the z-direction. The magnetization reference layer 35 includes ferromagnetic layers 36 and 38 and an intermediate layer 37.

The magnetic recording layer 11 has a central region CA1 and an outer region OA1. In the magnetic recording layer 11, the central region CA1 is a region where the first ferromagnetic layer 4 overlaps the second ferromagnetic layer 2 in the z-direction. The outer region OA1 is a region in which the first ferromagnetic layer 4 and the second ferromagnetic layer 2 do not overlap each other in the z-direction.

In a plan view from the z-direction, the first conductive layer 40 overlaps the outer region OA1, and the second conductive layer 50 overlaps the central region CAL The magnetoresistance effect element 101 according to the first modification example has similar effects to those of the magnetoresistance effect element 100 according to the first embodiment. Further, in the magnetoresistance effect element 101, a magnetic domain wall DW is easily introduced. In the magnetoresistance effect element 101, when a large external magnetic field is applied in one direction and then the magnetic field is removed, the magnetic domain wall DW is introduced. The reason is as follows. In the outer region OA1, the second ferromagnetic layer 2 is magnetized in a direction in which the external magnetic field is applied, even after the external magnetic field is removed. In the central region CA1, the second ferromagnetic layer 2 is magnetized by the antiferromagnetic coupling with the first ferromagnetic layer 4, in a direction opposite to the direction in which the external magnetic field is applied.

Second Modification Example

Figure 8:
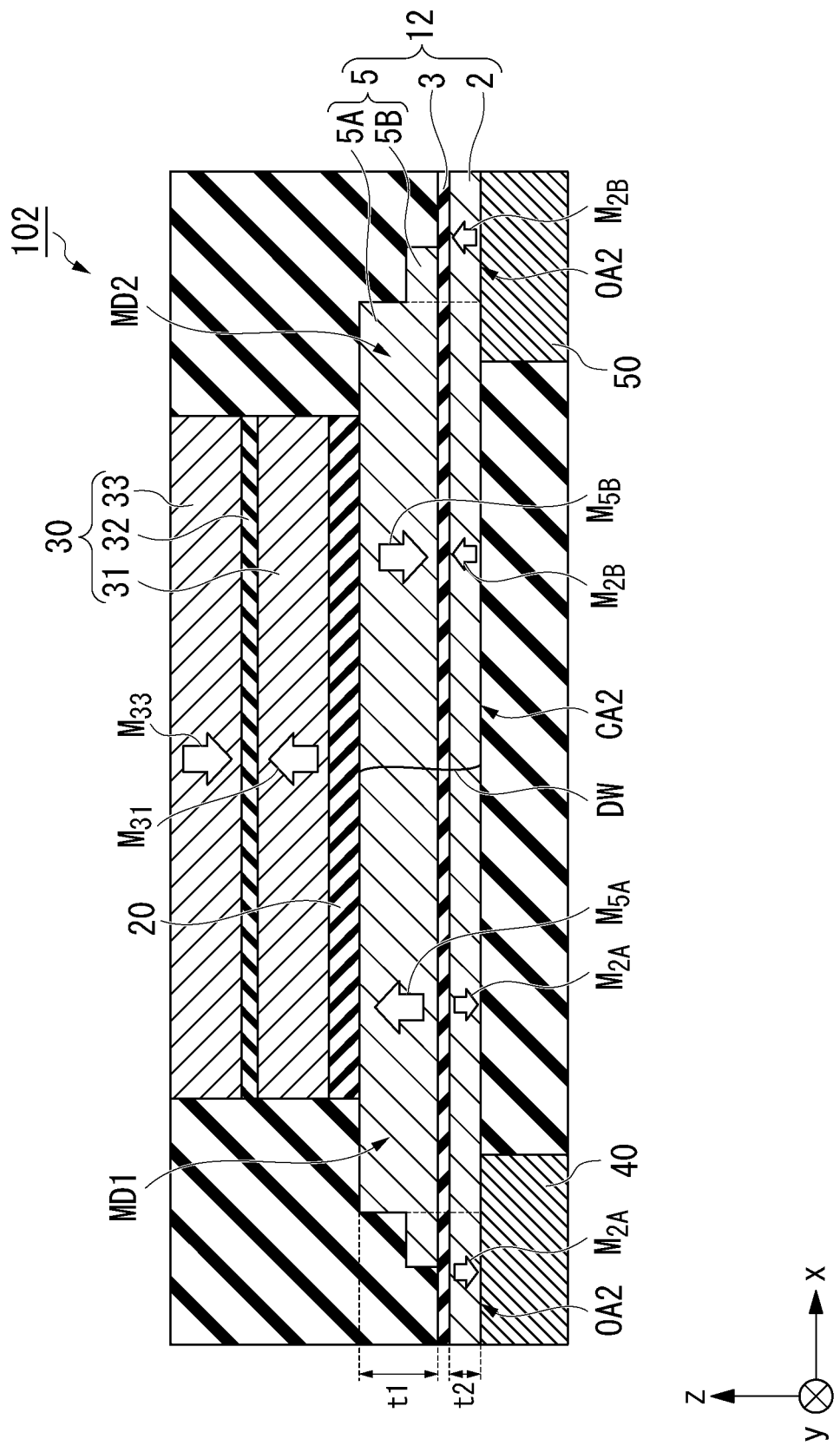
FIG. 8 is a cross-sectional view of a magnetoresistance effect element according to a second modification example.

FIG. 8 is a cross-sectional view obtained by cutting a magnetoresistance effect element 102 according to a second modification example in the xz plane passing through the center of a magnetic recording layer 12 in the y-direction. The magnetoresistance effect element 102 is different from the magnetoresistance effect element 100 in that a first ferromagnetic layer 5 of the magnetic recording layer 12 has a portion having a different film thickness. In FIG. 8, description of similar components to those in FIG. 3 is omitted.

The magnetic recording layer 12 includes the first ferromagnetic layer 5, the spacer layer 3, and the second ferromagnetic layer 2. The first ferromagnetic layer 5 is configured by a first region 5A having a film thickness as a first film thickness and a second region 5B having a film thickness different from the first film thickness. The second region 5B is outside the first region 5A in the x-direction and the y-direction. The second region 5B may cover the end portion of the magnetoresistance effect element 104, specifically, the end portion of the spacer layer 3.

The magnetic recording layer 12 has a central region CA2 and an outer region OA2. In the magnetic recording layer 12, in the central region CA2, for example, the first region 5A and the second ferromagnetic layer 2 overlap each other in the z-direction. The outer region OA2 includes, for example, the second region 5B. The product of the film thickness and the saturation magnetization of the first ferromagnetic layer 1 in the outer region OA2 is the product of the film thickness and the saturation magnetization of the second region 5B.

The magnetoresistance effect element 102 according to the second modification example has similar effects to those of the magnetoresistance effect element 100 according to the first embodiment. Further, in the magnetoresistance effect element 102, by providing the second region 5B, a situation occurs in which the relationship of the magnetization between the first ferromagnetic layer 5 and the second ferromagnetic layer 2 changes rapidly. As a result, it is possible to avoid the formation of the magnetic domain wall DW at an unintended position of the magnetic recording layer 12.

Third Modification Example

Figure 9:
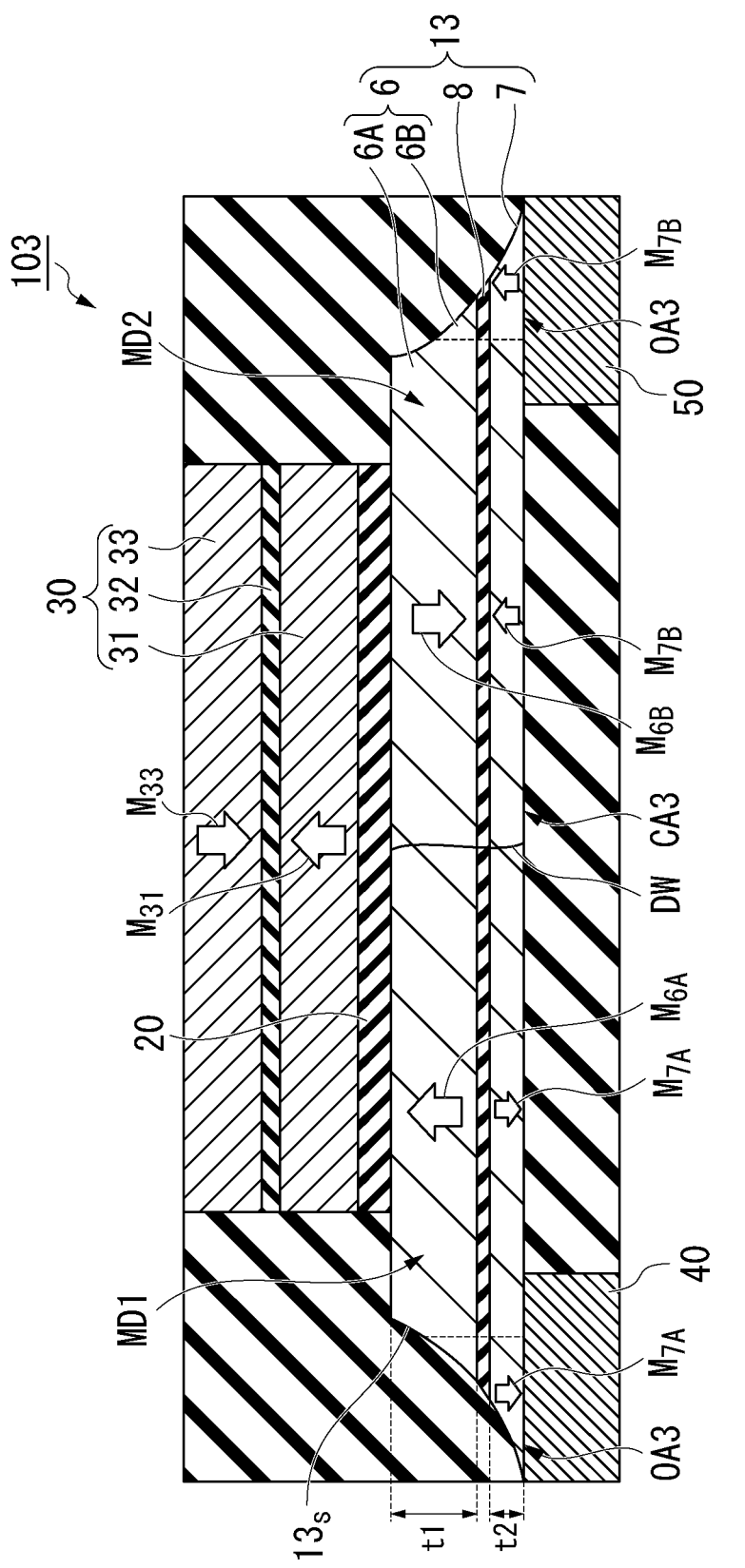
FIG. 9 is a cross-sectional view of a magnetoresistance effect element according to a third modification example.

FIG. 9 is a cross-sectional view obtained by cutting a magnetoresistance effect element 103 according to a third modification example in the xz plane passing through the center of a magnetic recording layer 13 in the y-direction. The magnetoresistance effect element 103 differs from the magnetoresistance effect element 100 in that a sidewall 13$s$ of the magnetic recording layer 13 is inclined with respect to the z-direction. In FIG. 9, description of similar components to those in FIG. 3 is omitted.

The magnetic recording layer 13 includes a first ferromagnetic layer 6, a spacer layer 8, and a second ferromagnetic layer 7. The first ferromagnetic layer 6 is configured by a first region 6A having a film thickness as a first film thickness and a second region 6B having a film thickness different from the first film thickness. The second region 6B is outside the first region 6A in the x-direction and the y-direction.

The magnetic recording layer 13 has a central region CA3 and an outer region OA3. In the magnetic recording layer 13, the central region CA3 is, for example, a region in which the film thickness of the first ferromagnetic layer 6 is thicker than the film thickness of the second ferromagnetic layer 7. The outer region OA3 is, for example, outside the central region CA3. The film thicknesses of the first ferromagnetic layer 6 and the second ferromagnetic layer 7 in the outer region OA3 are average film thicknesses.

The sidewalls of the first ferromagnetic layer 6, the spacer layer 8, and the second ferromagnetic layer 7 are continuous and form the sidewall 13$s$ as a whole. Here, the sidewalls being continuous means that the inclination of the inclination angle of the side surface on the cut surface by the xz plane or the yz plane changes continuously.

The magnetoresistance effect element 103 according to the third modification example has similar effects to those of the magnetoresistance effect element 100 according to the first embodiment. Further, a write current flowing between the first conductive layer 40 and the second conductive layer 50 flows smoothly, and it is possible to avoid local heat generation and the like.

Fourth Modification Example

Figure 10:
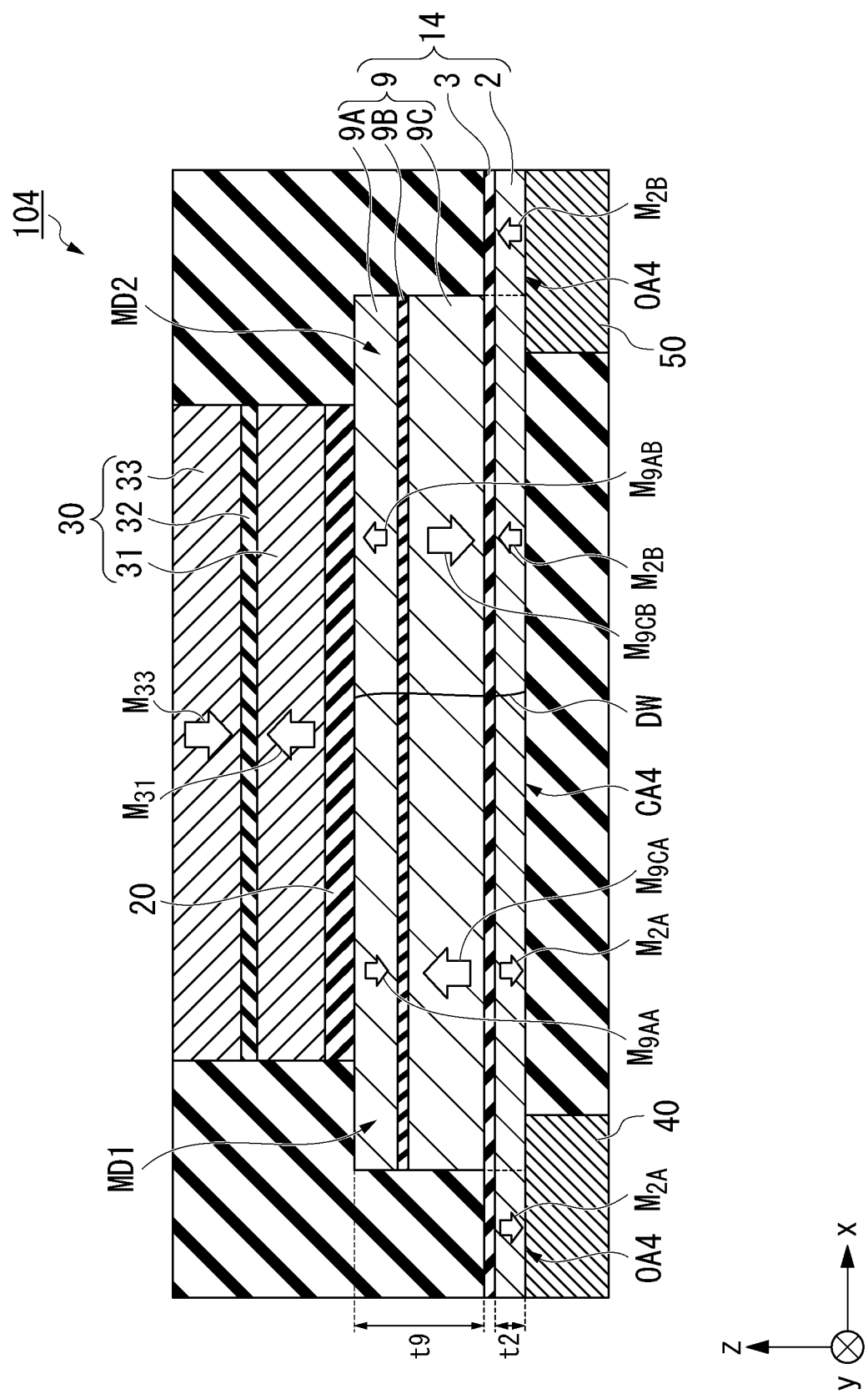
FIG. 10 is a cross-sectional view of a magnetoresistance effect element according to a fourth modification example.

FIG. 10 is a cross-sectional view obtained by cutting a magnetoresistance effect element 104 according to a fourth modification example in the xz plane passing through the center of a magnetic recording layer 14 in the y-direction. The magnetoresistance effect element 104 is different from the magnetoresistance effect element 100 in that a first ferromagnetic layer 9 is consists of a plurality of layers. In FIG. 10, description of similar components to those in FIG. 3 is omitted.

The magnetic recording layer 14 includes the first ferromagnetic layer 9, the spacer layer 3, and the second ferromagnetic layer 2. The second ferromagnetic layer 2 projects outward more than the first ferromagnetic layer 9 in a plan view from the z-direction.

The first ferromagnetic layer 9 is configured by a first layer 9A, a second layer 9B, and a third layer 9C. The second layer 9B is sandwiched between the first layer 9A and the third layer 9C. The first layer 9A and the third layer 9C are made of ferromagnets. The first layer 9A and the third layer 9C are made of, for example, a similar material to the material of the first ferromagnetic layer 1. The magnetizations $M_{9AA}$ and $M_{9AB}$ of the first layer 9A are antiferromagnetically coupled with the magnetizations $M_{9CA}$ and $M_{9B3}$ of the third layer 9C. The second layer 9B is made of a non-magnetic material. The second layer 9B is made of, for example, a similar material to the material of the spacer layer 3.

The magnetic recording layer 14 has a central region CA4 and an outer region OA4. In the magnetic recording layer 14, in the central region CA4, for example, the product of the film thickness t9 and the saturation magnetization of the first ferromagnetic layer 9 is greater than the product of the film thickness t2 and the saturation magnetization of the second ferromagnetic layer 2. The film thickness t9 of the first ferromagnetic layer 9 is the sum of the film thicknesses of the first layer 9A and the third layer 9C. The saturation magnetization of the first ferromagnetic layer 9 is the difference between the saturation magnetization of the first layer 9A and the saturation magnetization of the third layer 9C. The outer region OA4 is a region, for example, in which the product of the film thickness t9 and the saturation magnetization of the first ferromagnetic layer 9 is smaller than the product of the film thickness t2 and the saturation magnetization of the second ferromagnetic layer 2. The outer region OA4 is, for example, outside the central region CA4.

The magnetoresistance effect element 104 according to the fourth modification example has similar effects to those of the magnetoresistance effect element 100 according to the first embodiment. Further, by setting the saturation magnetization of the first ferromagnetic layer 9 as the difference between the saturation magnetization of the first layer 9A and the saturation magnetization of the third layer 9C, it is easy to adjust the saturation magnetization of the first ferromagnetic layer 9. In addition, the case where the first ferromagnetic layer 9 includes three layers has been described as an example, but the number of layers of the first ferromagnetic layer does not matter. Further, the second ferromagnetic layer 2 may be consists of a plurality of layers.

Fifth Modification Example

Figure 11:
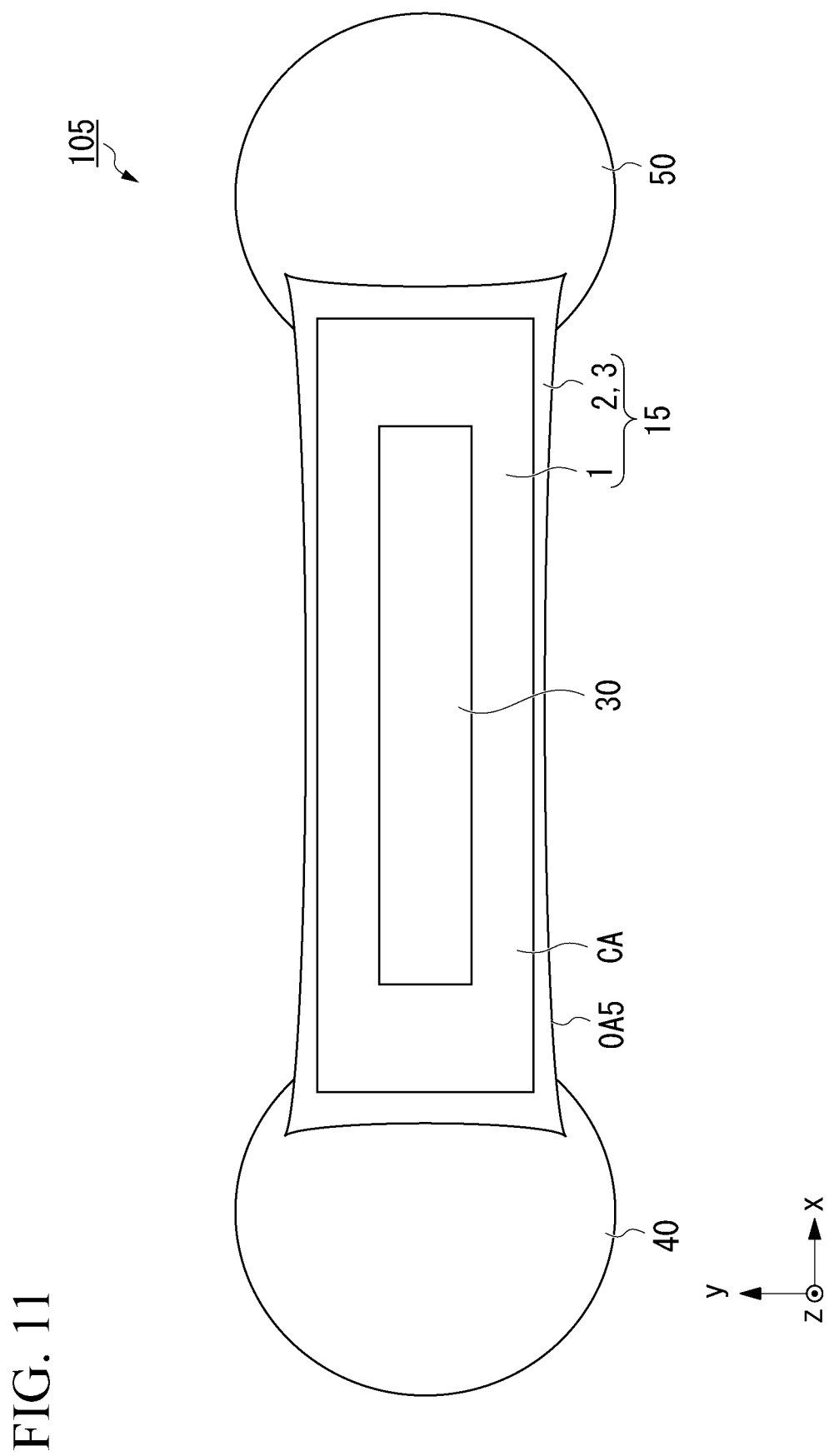
FIG. 11 is a plan view of a magnetoresistance effect element according to a fifth modification example.

FIG. 11 is a plan view of a magnetoresistance effect element 105 according to a fifth modification example in a plan view from the z-direction. The magnetoresistance effect element 105 is different from the magnetoresistance effect element 100 in that the protrusion width of an outer region OA5 from the central region CA differs depending on the location. In FIG. 11, description of similar components to those in FIG. 5 is omitted.

The magnetic recording layer 15 has the central region CA and the outer region OA5. The protrusion width of the outer region OA5 from the central region CA has an end portion that is wider than the center in the x-direction and the y-direction. The saturation magnetization of the second ferromagnetic layer 2 is smaller than that of the first ferromagnetic layer 1, and the moving speed of the magnetic domain wall DW is high. When the width of the second ferromagnetic layer 2 is widened from the center of the element toward the end portion, the current density decreases with approaching the end portion of the element. When the current density decreases with approaching the end portion of the element, the moving speed of the magnetic domain wall DW becomes slower with approaching the end portion of the element. As a result, it is possible to prevent the occurrence of a situation in which the magnetic domain wall DW reaches the end portion of the element to form a single magnetic domain.

The magnetoresistance effect element 105 according to the fifth modification example has similar effects to those of the magnetoresistance effect element 100 according to the first embodiment.

Sixth Modification Example

Figure 12:
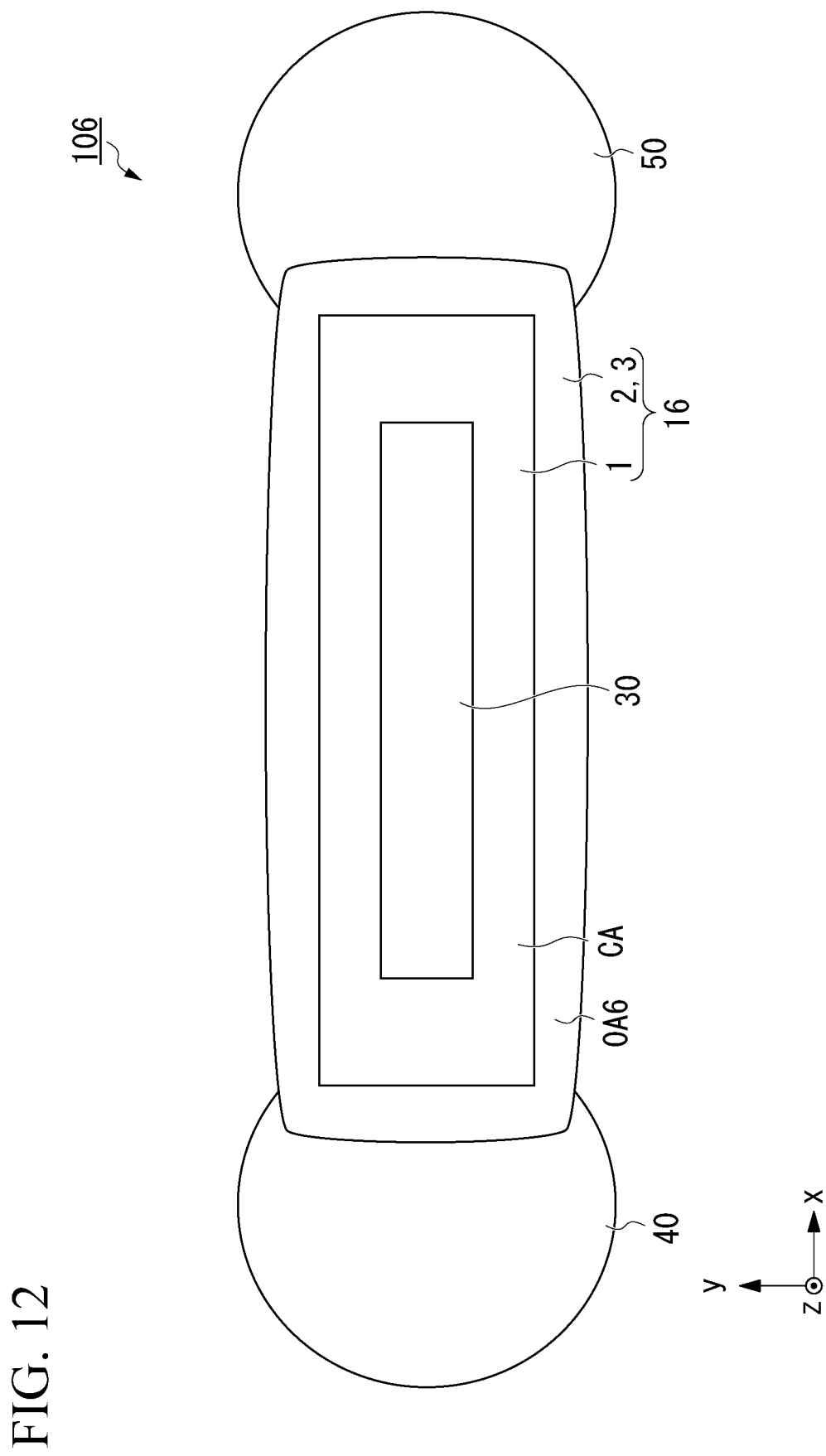
FIG. 12 is a plan view of a magnetoresistance effect element according to a sixth modification example.

FIG. 12 is a plan view of a magnetoresistance effect element 106 according to a sixth modification example in a plan view from the z-direction. The magnetoresistance effect element 106 is different from the magnetoresistance effect element 100 in that the protrusion width of an outer region OA6 from the central region CA differs depending on the location. In FIG. 12, description of similar components to those in FIG. 5 is omitted.

The magnetic recording layer 16 has the central region CA and the outer region OA6. The protrusion width of the outer region OA6 from the central region CA has an end portion that is narrower than the center in the x-direction and the y-direction. When the shape of the second ferromagnetic layer corresponding to the outer peripheral portion of the magnetoresistance effect element 106 when viewed from the z-direction approaches an elliptical shape, it is possible to reduce the in-plane stress generated in the magnetoresistance effect element 106 and suppress generation of an influence on the characteristics of the magnetoresistance effect element 106.

The magnetoresistance effect element 106 according to the sixth modification example has similar effects to those of the magnetoresistance effect element 100 according to the first embodiment.

Seventh Modification Example

Figure 13:
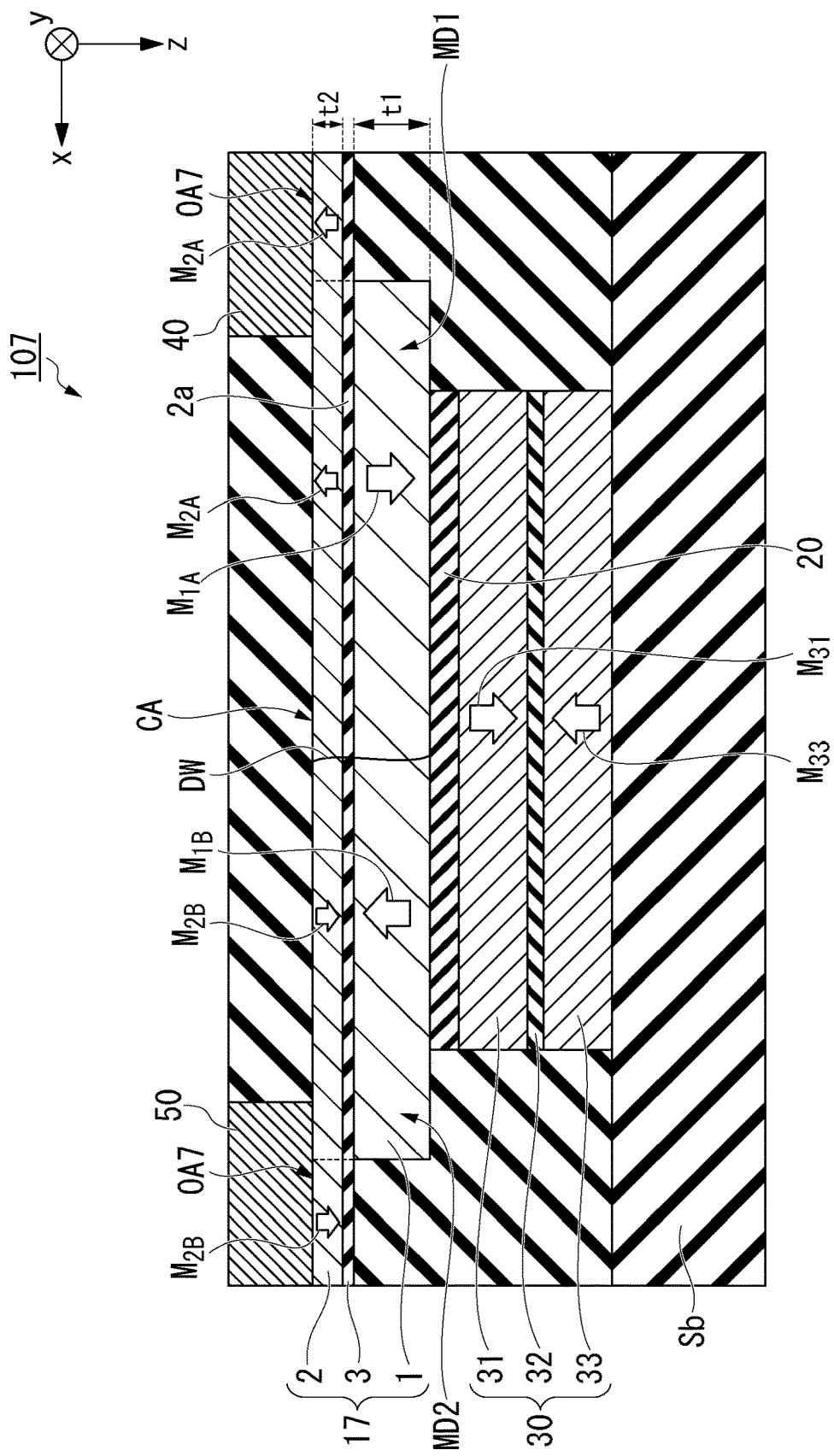
FIG. 13 is a cross-sectional view of a magnetoresistance effect element according to a seventh modification example.

FIG. 13 is a cross-sectional view obtained by cutting a magnetoresistance effect element 107 according to a seventh modification example in the xz plane passing through the center of the magnetic recording layer 11 in the y-direction. The magnetoresistance effect element 107 is different from the magnetoresistance effect element 100 in that magnetoresistance effect element 107 has a bottom pin structure. That is, in the magnetoresistance effect element 107, the magnetization reference layer 30, the non-magnetic layer 20, and a magnetic recording layer 17 are laminated on the substrate Sb in this order. The magnetization reference layer 30 includes the ferromagnetic layer 33, the intermediate layer 32, and the ferromagnetic layer 31 in this order from the substrate Sb side. The magnetic recording layer 17 includes the first ferromagnetic layer 1, the spacer layer 3, and the second ferromagnetic layer 2 in this order from the substrate Sb side. In FIG. 13, description of similar components to those in FIG. 3 is omitted.

In the magnetoresistance effect element 107, the positional relationship between the magnetization reference layer 30 and the magnetic recording layer 17 with respect to the substrate Sb is reversed, and thus the magnetoresistance effect element 107 exhibits similar effects to those of the magnetoresistance effect element 100 of the first embodiment. Further, in the magnetoresistance effect element 107, the magnetization reference layer 30 having the fixed magnetization is disposed near the substrate Sb. Thus, the stability of the magnetization of the magnetization reference layer 30 is enhanced, and the MR ratio is increased.

Second Embodiment

Figure 14:
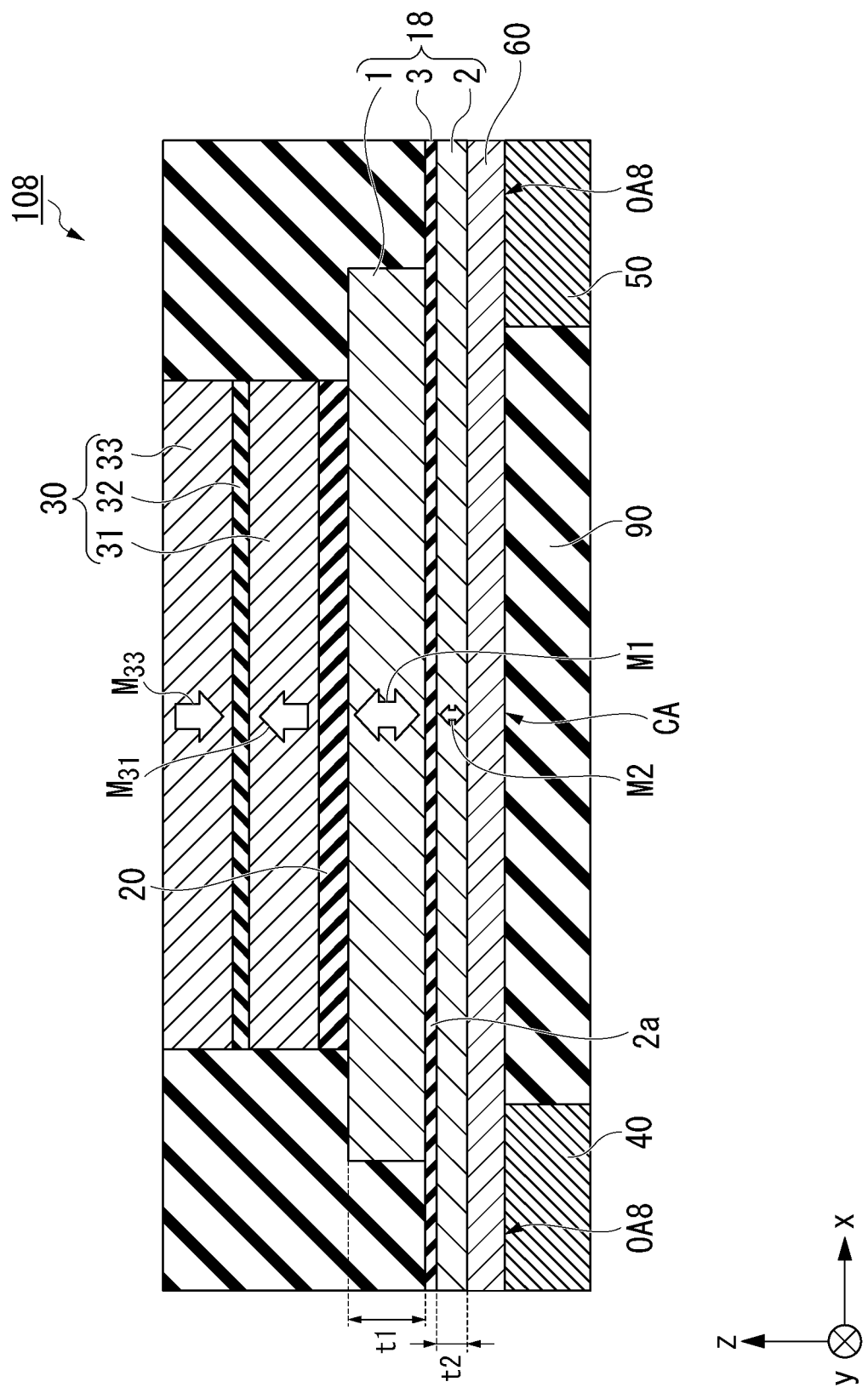
FIG. 14 is a cross-sectional view of a magnetoresistance effect element according to a second embodiment.

FIG. 14 is a configuration diagram of a magnetoresistance effect element 108 according to a second embodiment. The magnetoresistance effect element 108 further includes a spin-orbit torque wiring 60. In the magnetoresistance effect element 108 according to the second embodiment, similar components to those of the magnetoresistance effect element 100 in the first embodiment are denoted by similar reference signs, and the description thereof will be omitted. The magnetoresistance effect element 108 according to the second embodiment is a magnetoresistance effect element that inverts the magnetization by using spin-orbit torque (SOT).

The spin-orbit torque wiring 60 is in contact with the surface of the magnetic recording layer 18 on an opposite side of the non-magnetic layer 20. The spin-orbit torque wiring is located between the magnetic recording layer 18, and the insulating layer 90, the first conductive layer 40, and the second conductive layer 50.

FIG. 14 illustrates a case where an outer region OA8 is provided at an end portion of the spin-orbit torque wiring 60 in an extending direction (x-direction). The outer region OA8 may be provided at an end portion in a direction (for example, an orthogonal direction) different from the extending direction. From the viewpoint of preventing a leakage magnetic field generated from the central region CA, it is preferable that the outer region OA8 be provided at the end portion of the spin-orbit torque wiring 60 in any direction.

Although FIG. 14 illustrates a state in which the magnetic recording layer 18 does not have the magnetic domain wall DW, the magnetic recording layer 18 may have the magnetic domain wall DW. When the magnetic recording layer 18 does not have the magnetic domain wall DW, the magnetoresistance effect element 108 records data in binary. When the magnetic recording layer 18 has the magnetic domain wall DW, the magnetoresistance effect element 108 records data in multiple values or analog.

The magnetoresistance effect element 108 controls the magnetic state (magnetization) of the magnetic recording layer 18 by the spin injected from the spin-orbit torque wiring 60. The spin injected into the second ferromagnetic layer 2 from the spin-orbit torque wiring 60 applies torque (spin orbit torque) to the magnetization M2 of the second ferromagnetic layer 2 to invert the magnetization M2 of the second ferromagnetic layer 2. When the magnetization M2 of the second ferromagnetic layer 2 is inverted, the magnetization M1 of the first ferromagnetic layer 1, which is magnetically coupled, is inverted. The spin is injected into the second ferromagnetic layer 2 from the spin-orbit torque wiring 60 by causing a current to flow along the spin-orbit torque wiring 60.

The spin-orbit torque wiring 60 contains any of metal, an alloy, an intermetallic compound, metal boride, metal carbide, metal silicate, metal phosphate, and metal nitride that have a function of generating a pure spin current by the spin Hall effect when a current flows.

The spin-orbit torque wiring 60 may contain non-magnetic heavy metal. Here, the heavy metal is used to mean metal having a specific density equal to or higher than that of yttrium. The spin-orbit torque wiring 60 may be made of only non-magnetic heavy metal. For example, the spin-orbit torque wiring is made of tungsten (W) or iridium (Ir). Further, when the spin-orbit torque wiring 60 is made of a compound such as a nitride, the non-magnetic metal is not limited to the heavy metal. For example, the spin-orbit torque wiring 60 may be made of tantalum nitride (TaN) or titanium nitride (TiN). Further, the spin-orbit torque wiring 60 may contain a magnetic element or may be made of a topological insulator.

In the magnetoresistance effect element 108 according to the second embodiment, a magnetic field generated in the outer region OA8 weakens a leakage magnetic field generated from the central region CA. Thus, the magnetoresistance effect element 108 has a small leakage magnetic field, and thus it is possible to bring other elements close to the magnetoresistance effect element 108, similar to the magnetoresistance effect element 100 according to the first embodiment. If the distance between the adjacent magnetoresistance effect elements 108 can be reduced, it is possible to enhance the integration of the magnetic recording array 200.

Hitherto, the preferred embodiments of the present invention have been described in detail above. However, the present invention is not limited to the examples described in the embodiments. For example, the characteristic components in the embodiments and the modification examples may be combined.

Figure 15:
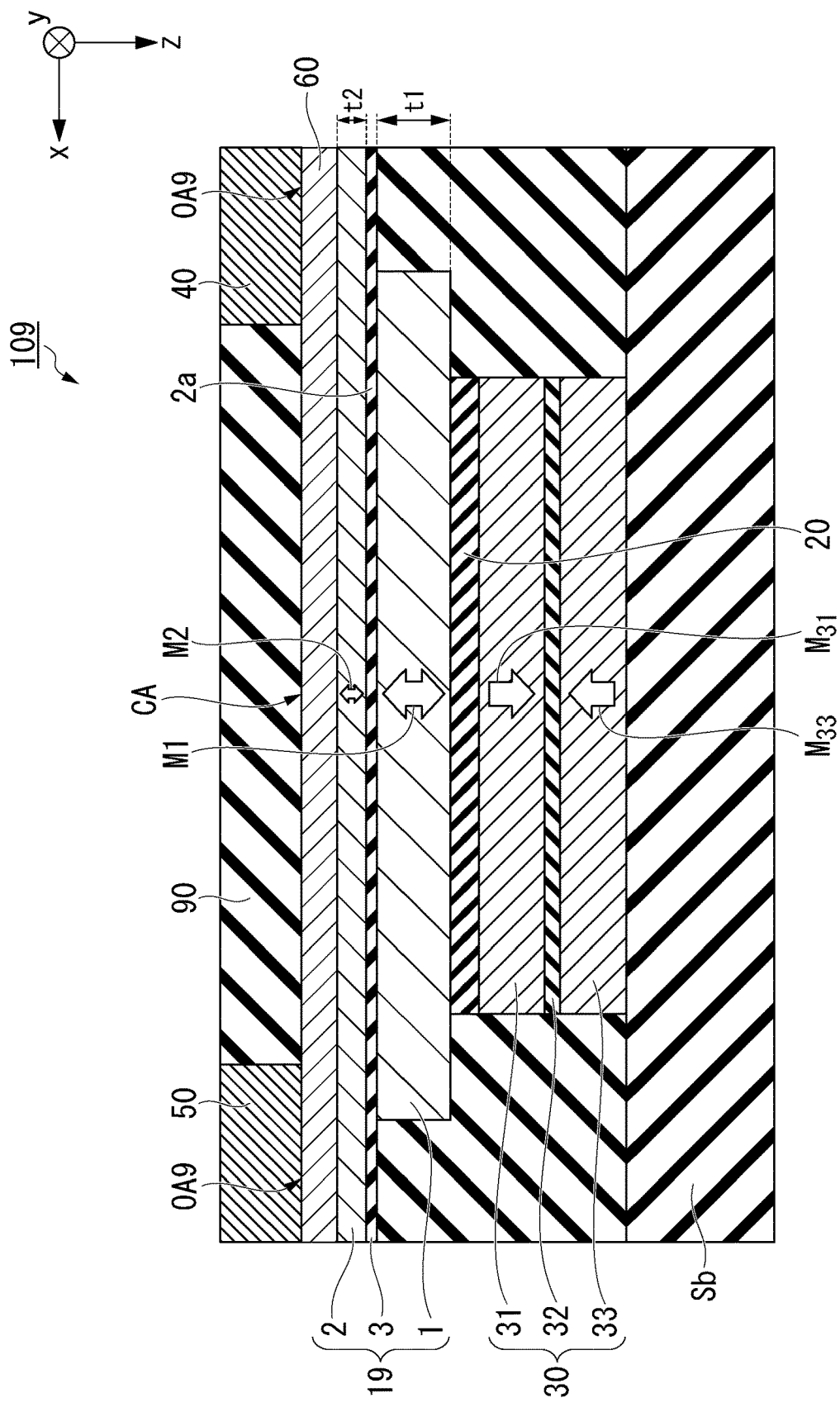
FIG. 15 is a cross-sectional view of a magnetoresistance effect element according to a modification example of the second embodiment.

For example, FIG. 15 is a cross-sectional view obtained by cutting a magnetoresistance effect element 109 according to a modification example of the second embodiment along the xz plane passing through the center of a magnetic recording layer 19 in the y-direction. The magnetoresistance effect element 109 is different from the magnetoresistance effect element 108 in that the magnetoresistance effect element 109 has a bottom pin structure. That is, the magnetoresistance effect element 109 is a combination of the configuration of the second embodiment and the configuration of the seventh modification example.

In the magnetoresistance effect element 109, the magnetization reference layer 30, the non-magnetic layer 20, and the magnetic recording layer 19 are laminated on the substrate Sb in this order. The magnetization reference layer 30 includes the ferromagnetic layer 33, the intermediate layer 32, and the ferromagnetic layer 31 in this order from the substrate Sb side. The magnetic recording layer 19 includes the first ferromagnetic layer 1, the spacer layer 3, and the second ferromagnetic layer 2 in this order from the substrate Sb side. In FIG. 15, description of similar components to those in FIG. 14 is omitted.

The magnetoresistance effect element 109 exhibits similar effects to those of the magnetoresistance effect element 108 in the second embodiment. Further, in the magnetoresistance effect element 109, the magnetization reference layer 30 having the fixed magnetization is disposed near the substrate Sb. Thus, the stability of the magnetization of the magnetization reference layer 30 is enhanced, and the MR ratio is increased.

Further, up to this point, an example of applying the magnetoresistance effect element to an example of the magnetic memory has been described. The magnetoresistance effect element is not limited to this example, and can also be applied to, for example, a racetrack memory for recording data on magnetic nanowires. When the magnetoresistance effect element is applied to a racetrack memory, the magnetic recording layer can correspond to magnetic nanowires, and the magnetic recording layer can have a plurality of magnetic domain walls.

REFERENCE SIGNS LIST 1, 4, 5, 6, 9: First ferromagnetic layer
2, 7: Second ferromagnetic layer
2a: First surface
3,8: Spacer layer
5A, 6A: First region
5B, 6B: Second region
10, 11, 12, 13, 14, 15, 16, 17, 18, 19: Magnetic recording layer
20, 21: Non-magnetic layer
30, 35: Magnetization reference layer
40: First conductive layer
50: Second conductive layer
60: Spin-orbit torque wiring
100, 101, 102, 103, 104, 105, 106, 107, 108, 109: Magnetoresistance effect element
200: Magnetic recording array
CA, CA1, CA2, CA3, CA4: Central region
DW: Magnetic domain wall
OA, OA1, OA2, OA3, OA4, OA5, OA6, OA7, OA8, OA9: Outer region
t1, t2, t9: Film thickness

What is claimed is:

1. A magnetoresistance effect element, comprising:
   a magnetic recording layer which includes a ferromagnetic material;
   a non-magnetic layer which is laminated on the magnetic recording layer; and
   a magnetization reference layer which is laminated on the non-magnetic layer,
   wherein the magnetic recording layer has a first ferromagnetic layer, a spacer layer, and a second ferromagnetic layer in order from the non-magnetic layer,
   the first ferromagnetic layer and the second ferromagnetic layer are antiferromagnetically coupled,
   the magnetic recording layer has
      a central region in which a product of a film thickness and a saturation magnetization of the first ferromagnetic layer is greater than a product of a film thickness and a saturation magnetization of the second ferromagnetic layer, and
      an outer region in which the product of the film thickness and the saturation magnetization of the first ferromagnetic layer is smaller than the product of the film thickness and the saturation magnetization of the second ferromagnetic layer, and
   the outer region is located outside the central region in a plan view from a laminating direction.

2. The magnetoresistance effect element according to claim 1,
   wherein the second ferromagnetic layer projects outward from the first ferromagnetic layer in a plan view from the laminating direction.

3. The magnetoresistance effect element according to claim 1,
   wherein the outer region is located at an end portion in a first direction in which the magnetic recording layer extends.

4. The magnetoresistance effect element according to claim 1, further comprising:
   a first conductive layer and a second conductive layer separated from each other in a first direction in which the magnetic recording layer extends and being connected to the magnetic recording layer,
   wherein at least one portion of the first conductive layer and at least one portion of the second conductive layer overlap the central region in a plan view from the laminating direction.

5. The magnetoresistance effect element according to claim 1, further comprising:
   a first conductive layer and a second conductive layer separated from each other in a first direction in which the magnetic recording layer extends and being connected to the magnetic recording layer,
   wherein the first conductive layer overlaps the outer region in a plan view from the laminating direction, and
   the second conductive layer overlaps the central region in a plan view from the laminating direction.

6. The magnetoresistance effect element according to claim 1,
   wherein the outer region is located at an end portion in a second direction intersecting a first direction in which the magnetic recording layer extends.

7. The magnetoresistance effect element according to claim 1,
   wherein the outer region is located at both an end portion in a first direction in which the magnetic recording layer extends and an end portion in a second direction intersecting the first direction.

8. The magnetoresistance effect element according to claim 1,
   wherein a portion of the outer region does not include the first ferromagnetic layer.

9. The magnetoresistance effect element according to claim 1,
   wherein the first ferromagnetic layer has a first region having a film thickness as a first film thickness and a second region having a film thickness different from the first film thickness, and
   the second region is located outside the first region in a plan view from the laminating direction.

10. The magnetoresistance effect element according to claim 1,
    wherein the spacer layer covers an entirety of a first surface of the second ferromagnetic layer on the first ferromagnetic layer side.

11. The magnetoresistance effect element according to claim 1,
    wherein a sidewall of the magnetic recording layer is inclined with respect to the laminating direction, and
    sidewalls of the first ferromagnetic layer, the spacer layer, and the second ferromagnetic layer are continuous.

12. The magnetoresistance effect element according to claim 1, further comprising:
    a spin-orbit torque wiring being in contact with a surface of the magnetic recording layer on an opposite side of the non-magnetic layer.

13. The magnetoresistance effect element according to claim 12,
wherein the outer region is located at an end portion in a direction different from a direction in which the spin-orbit torque wiring extends.

14. The magnetoresistance effect element according to claim 1,
wherein a length from a boundary between the outer region and the central region to an end portion of the outer region is equal to or smaller than 10 times a film thickness of the first ferromagnetic layer in the central region.

15. The magnetoresistance effect element according to claim 1,
wherein the first ferromagnetic layer consists of a plurality of layers,
the plurality of layers include a plurality of ferromagnetic layers and a second spacer layer between the plurality of ferromagnetic layers, and
the plurality of ferromagnetic layers are antiferromagnetically coupled to each other.

16. The magnetoresistance effect element according to claim 1, further comprising:
a magnetic domain wall inside the magnetic recording layer.

17. A magnetic recording array having a plurality of the magnetoresistance effect elements according to claim 1.

* * * * *